(12) United States Patent
Ikeno et al.

(10) Patent No.: US 10,971,358 B2
(45) Date of Patent: Apr. 6, 2021

(54) METHOD OF MAKING A PEELED MAGNESIUM OXIDE SUBSTRATE USING LASER IRRADIATION

(71) Applicants: Shin-Etsu Polymer Co., Ltd., Tokyo (JP); Shin-Etsu Chemical Co., Ltd., Tokyo (JP); National University Corporation Saitama University, Saitama (JP)

(72) Inventors: Junichi Ikeno, Saitama (JP); Yohei Yamada, Saitama (JP); Hideki Suzuki, Saitama (JP); Hitoshi Noguchi, Annaka (JP)

(73) Assignees: SHIN-ETSU POLYMER CO., LTD., Tokyo (JP); SHIN-ETSU CHEMICAL CO., LTD., Tokyo (JP); NATIONAL UNIVERSITY CORPORATION SAITAMA UNIVERSITY, Saitama (JP)

( * ) Notice: Subject to any disclaimer, the term of this patent is extended or adjusted under 35 U.S.C. 154(b) by 0 days.

(21) Appl. No.: 16/296,702

(22) Filed: Mar. 8, 2019

(65) Prior Publication Data
US 2019/0279867 A1   Sep. 12, 2019

(30) Foreign Application Priority Data
Mar. 9, 2018   (JP) .............................. JP2018-043006

(51) Int. Cl.
*C30B 33/02*   (2006.01)
*H01L 21/02*   (2006.01)
(Continued)

(52) U.S. Cl.
CPC .... *H01L 21/02414* (2013.01); *B23K 26/0006* (2013.01); *B23K 26/0861* (2013.01);
(Continued)

(58) Field of Classification Search
CPC .. C30B 1/00; C30B 1/02; C30B 29/00; C30B 29/10; C30B 29/16; C30B 30/00;
(Continued)

(56) References Cited

U.S. PATENT DOCUMENTS

| 2009/0056513 | A1* | 3/2009 | Baer | ...................... | B23K 26/40 |
| | | | | | 83/15 |
| 2013/0126573 | A1* | 5/2013 | Hosseini | ............ | B23K 26/0622 |
| | | | | | 225/2 |

(Continued)

FOREIGN PATENT DOCUMENTS

| CN | 103781949 A | 5/2014 |
| EP | 3396031 A1 | 10/2018 |

(Continued)

OTHER PUBLICATIONS

Samant, et al. entitled "Laser machining of structural ceramics—A review," Journal of the European Ceramic Society, vol. 29, pp. 969-993 (2009). (Year: 2009).*

(Continued)

*Primary Examiner* — Kenneth A Bratland, Jr.
(74) *Attorney, Agent, or Firm* — Nath, Goldberg & Meyer; Jerald L. Meyer

(57) ABSTRACT

A substrate manufacturing method capable of easily obtaining a thin magnesium oxide single crystal substrate is provided. A first step is performed which disposes a condenser for condensing a laser beam on an irradiated surface of a magnesium oxide single crystal member in a non-contact manner. A second step is performed which forms processing mark lines in parallel by irradiating the laser beam to the surface of the single crystal substrate under designated irradiation conditions to condense the laser beam into an inner portion of the single crystal substrate while moving the condenser and the single crystal substrate relative to each other in a two-dimensional manner. A third step (Continued)

is performed which forms new processing mark lines between the adjacent irradiation lines in the second step to allow planar separation, by irradiating the laser beam to the surface of the single crystal substrate under designated irradiation conditions to condense the laser beam into an inner portion of the single crystal substrate while moving the condenser and the single crystal substrate 20 relative to each other in a two-dimensional manner.

8 Claims, 21 Drawing Sheets

(51) Int. Cl.
| | | |
|---|---|---|
| *C30B 29/16* | (2006.01) | |
| *H01L 23/544* | (2006.01) | |
| *B23K 26/00* | (2014.01) | |
| *B23K 26/08* | (2014.01) | |
| *B23K 26/53* | (2014.01) | |
| *B23K 103/08* | (2006.01) | |
| *B23K 101/18* | (2006.01) | |
| *B23K 101/40* | (2006.01) | |

(52) U.S. Cl.
CPC .............. *B23K 26/53* (2015.10); *C30B 29/16* (2013.01); *H01L 21/0242* (2013.01); *H01L 21/02658* (2013.01); *H01L 23/544* (2013.01); *B23K 2101/18* (2018.08); *B23K 2101/40* (2018.08); *B23K 2103/08* (2018.08); *H01L 2223/54453* (2013.01)

(58) Field of Classification Search
CPC ......... C30B 31/00; C30B 31/20; C30B 33/00; C30B 33/02; C30B 33/06; H01L 21/02414; H01L 21/02527; H01L 21/7813; H01L 21/0242; H01L 21/02658; H01L 2223/54453; H01L 23/544; B23K 26/0006; B23K 26/0861; B23K 2101/18; B23K 2101/40; B23K 2103/08; B32B 43/006

USPC ............ 117/2–4, 7, 108, 904, 915, 937, 944
See application file for complete search history.

(56) References Cited

U.S. PATENT DOCUMENTS

| | | | |
|---|---|---|---|
| 2018/0315657 A1* | 11/2018 | Ikeno | ...................... C30B 29/16 |
| 2019/0105739 A1* | 4/2019 | Ikeno | ................. B23K 26/0853 |

FOREIGN PATENT DOCUMENTS

| | | | |
|---|---|---|---|
| JP | 200180996 A | | 3/2001 |
| JP | 4100953 B2 | | 10/2003 |
| JP | 2008044807 A | | 2/2008 |
| JP | 2011-003624 A | | 1/2011 |
| JP | 2013049161 A | * | 3/2013 |
| JP | 201559069 A | | 3/2015 |
| TW | 201345640 A | | 11/2013 |
| TW | 201615316 A | | 5/2016 |

OTHER PUBLICATIONS

Official Action dated Oct. 18, 2019, in counterpart TW application No. 108107863, with English translation.
Samant, Anoop N., et al; "Laser machining of structural ceramics—A review" Journal of the European Ceramic Society; Elsevier Science Publishers; vol. 29, No. 6; Apr. 1, 2009; pp. 969-993.
European Search Report; dated Aug. 12, 2019; Corresponding to EP Application No. 19161290.2.
Office Action dated Mar. 17, 2020, in corresponding Korean patent application No. 10-2019-0026431, with English translation.
Communication Pursuant to Article 94(3) EPC dated Sep. 9, 2020 corresponding to European Application No. 19161290.1-1016.

* cited by examiner

| LASER BEAM WAVELENGTH (nm) | | 1030 |
|---|---|---|
| PULSE FREQUENCY (kHz) | | 10 |
| PULSE WIDTH (ps) | | 10 |
| OUTPUT POWER (mW) | | 25 |
| NUMERICAL APERTURE(NA) ($\theta$ =58.2°) | | 0.85 |
| CORRECTION RING(mm) | | 0.3 |
| DEFOCUSING VALUE(DF)($\mu$m) | | −50 |
| DOT PITCH($\mu$m) | | 7 |
| LINE PITCH ($\mu$m) | FIRST IRRADIATION LINES | 8 |
| | SECOND IRRADIATION LINES | 8 |
| | BETWEEN FIRST AND SECOND IRRADIATION LINES | 4 |
| NUMBER OF LINES | | 2500 |

FIG. 10
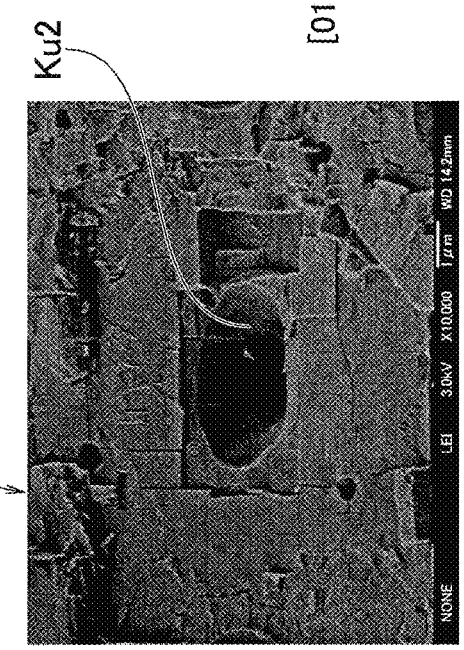
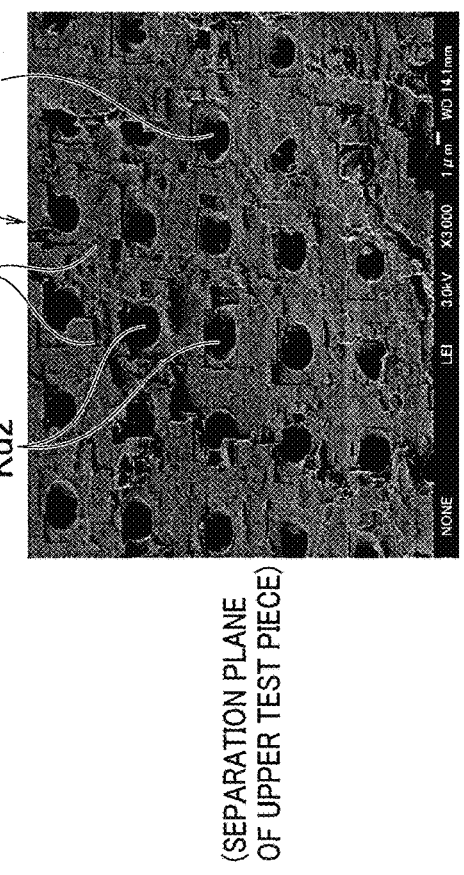
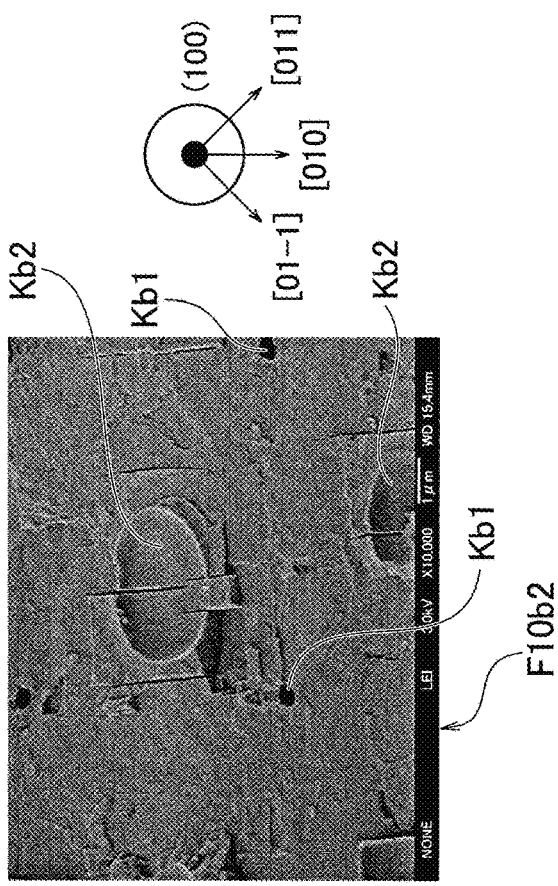
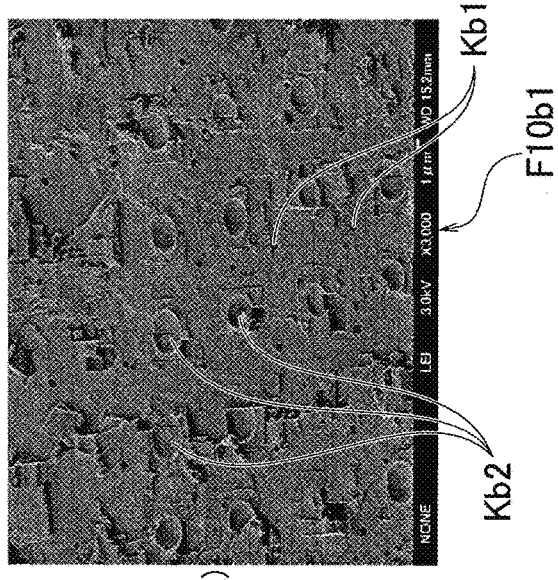

(OBSERVATION AT ANGLE OF 50°)

J1u, Su2, Ku2

(OBSERVATION OF CROSS SECTION)

J1u, Su2, Ku2

FIG. 14A (OBSERVATION AT ANGLE OF 50°)
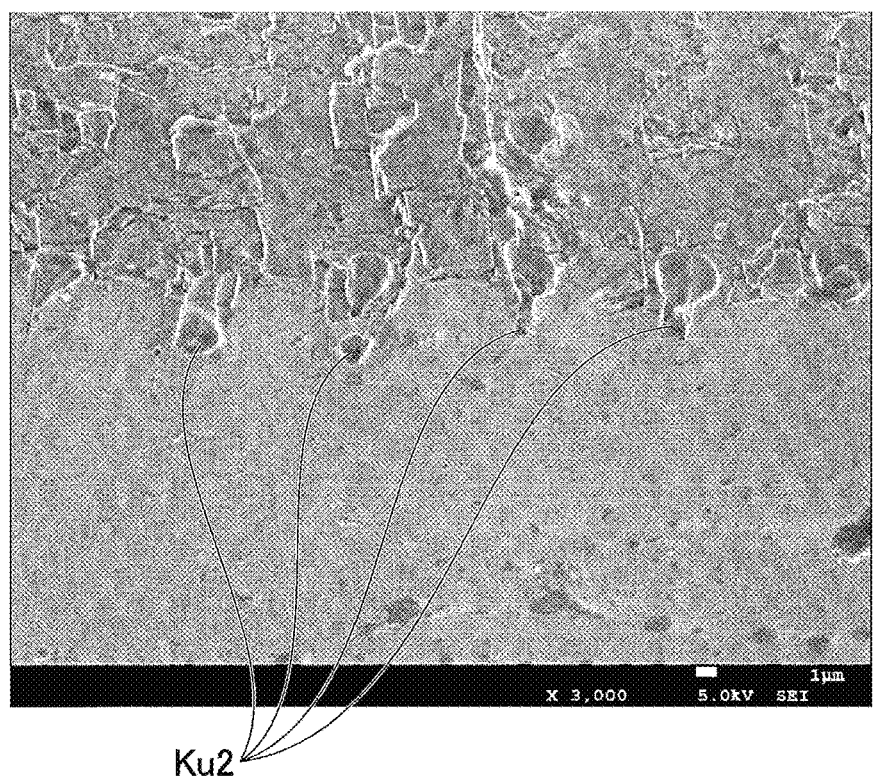
Ku2
FIG. 14B (OBSERVATION OF CROSS SECTION)
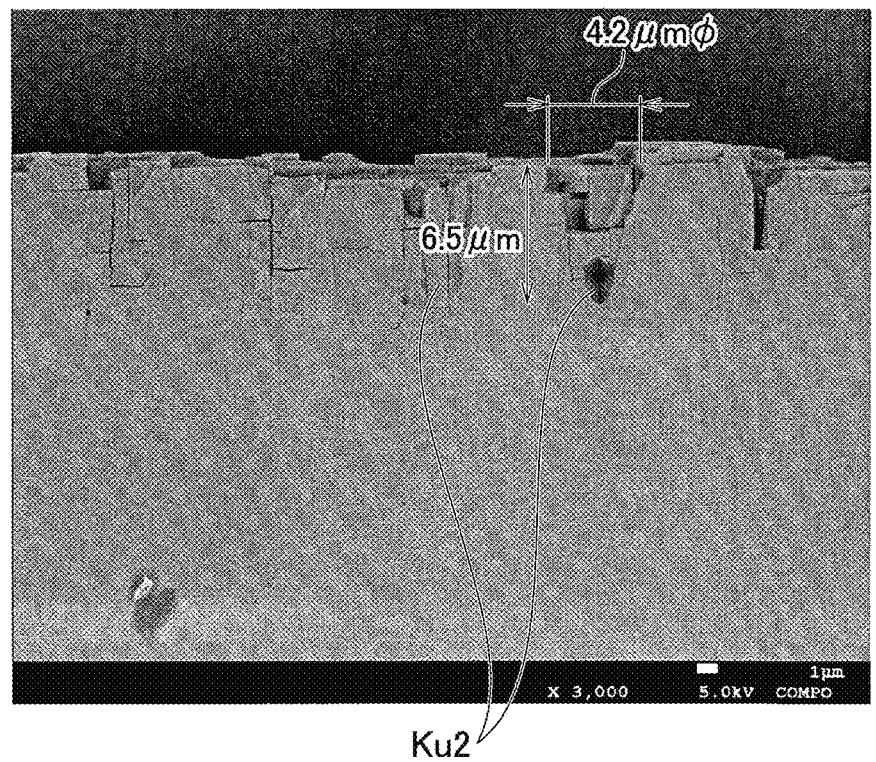
Ku2

FIG. 15A (OBSERVATION AT ANGLE OF 50°)
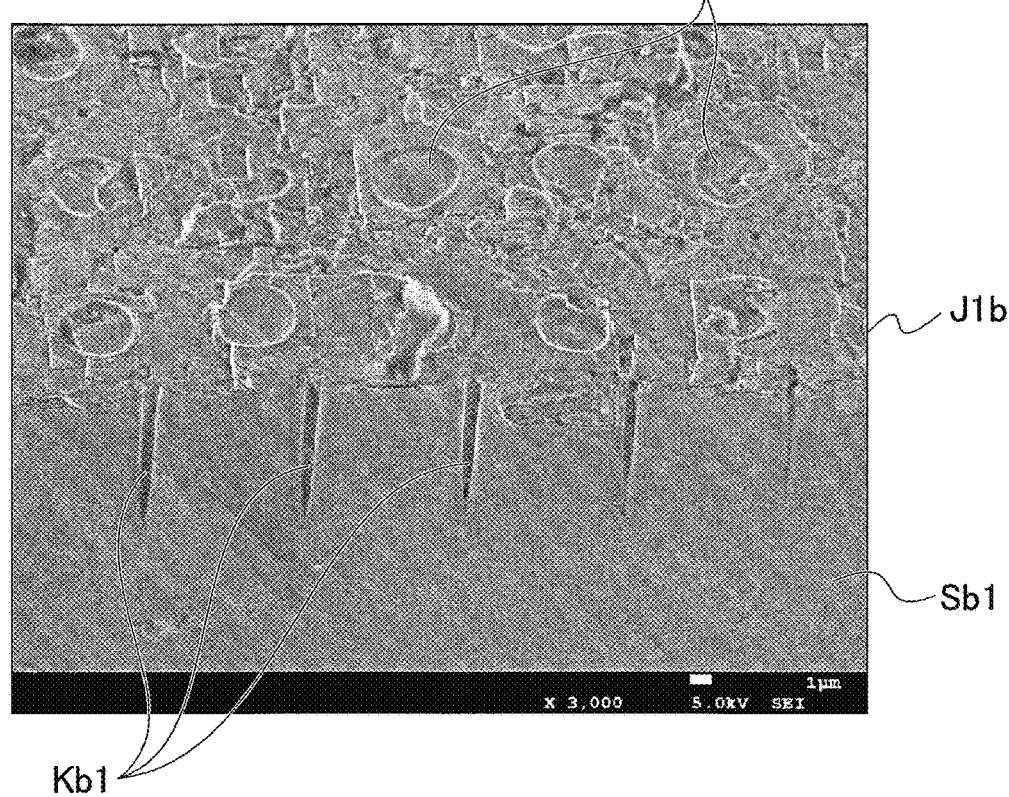
FIG. 15B (OBSERVATION OF CROSS SECTION)
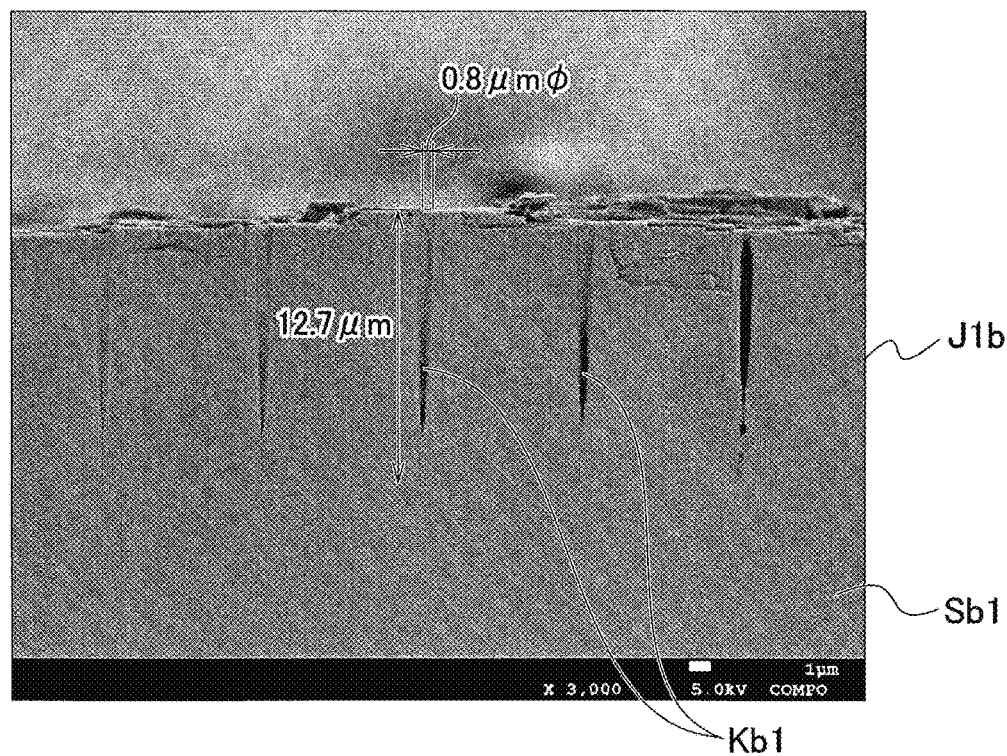

(OBSERVATION AT ANGLE OF 50°) Kb2

Kb1

(OBSERVATION OF CROSS SECTION)

0.8 μmφ

12.0 μm

Kb1

METHOD OF MAKING A PEELED MAGNESIUM OXIDE SUBSTRATE USING LASER IRRADIATION

CROSS REFERENCE TO RELATED APPLICATION

This application claims priority of Japanese patent application No. 2018-43006 filed Mar. 9, 2018, entitled "Substrate Manufacturing Method," the entire contents of which being herein incorporated by reference.

TECHNICAL FIELD

The present disclosure relates to a substrate manufacturing method optimal for manufacturing a thin magnesium oxide single crystal substrate.

BACKGROUND ART

A magnesium oxide single crystal substrate is used in the field of semiconductor, the field of display, the field of energy, and the like. In order to manufacture this magnesium oxide single crystal substrate, epitaxially growing this magnesium oxide single crystal substrate into a thin film shape is known as well as crystal-growing the magnesium oxide single crystal substrate into a bulk form and cutting the same into a substrate form (for example, refer to JP 2001-80996 A).

Meanwhile, it is thought that diamond is a semiconductor suitable for a high-frequency/high-output electronic device, and in vapor-phase synthesis as one of synthesis methods thereof, a magnesium oxide substrate or a silicon substrate is used as a base substrate (for example, refer to JP 2015-59069 A).

SUMMARY

Technical Problem

In recent years, as performance of a semiconductor device has been increased, a magnesium oxide single crystal substrate, which is thin and has less lattice defects, has been being required more and more.

A magnesium oxide substrate (MgO substrate) that is a base substrate in manufacture of the above diamond substrate is expensive, and for example, the magnesium oxide substrate is peeled off and separated while keeping a thickness thereof necessary as a base substrate after subjecting single crystal diamond to vapor-phase synthesis, whereby the magnesium oxide substrate becomes reusable as the base substrate. Specifically, for example, if a magnesium oxide substrate with a thickness of 180 μm is obtained and reused from a base substrate of magnesium oxide with a thickness of 200 μm, then it can be expected that significant cost reduction can be achieved in a manufacturing process of the diamond substrate, and that this achievement greatly contributes to cost reduction of the diamond substrate.

In view of the above problem, it is an object of the present disclosure to provide a substrate manufacturing method capable of easily obtaining the thin magnesium oxide single crystal substrate.

Solution to Problem

Incidentally, while a variety of manufacturing methods for obtaining a single crystal silicon substrate have been proposed, the inventor of the present disclosure found a manufacturing method, which is targeted for the magnesium oxide substrate and based on a new processing principle different from that of single crystal silicon, as a result of earnest study in the present disclosure.

In accordance with an aspect of the present disclosure for solving the above problems, provided is a substrate manufacturing method including: a first step of disposing a condenser for condensing a laser beam in a non-contact manner on an irradiated surface of a single crystal member of magnesium oxide to be irradiated; a second step of irradiating a laser beam to a surface of the single crystal member and condensing the laser beam into an inner portion of the single crystal member under designated irradiation conditions using the condenser, and at a same time, two-dimensionally moving the condenser and the single crystal member relatively to each other, and sequentially forming processing mark lines in parallel; and a third step of irradiating a laser beam to a surface of the single crystal member and condensing the laser beam into an inner portion of the single crystal member under designated irradiation conditions using the condenser, and at a same time, two-dimensionally moving the condenser and the single crystal member relatively to each other, and forming new processing mark lines between the adjacent processing mark lines formed by the irradiation in the second step to allow planar separation.

Effects

In accordance with the present disclosure, the substrate manufacturing method capable of easily obtaining the thin magnesium oxide single crystal substrate can be provided.

BRIEF DESCRIPTION OF DRAWINGS

FIG. 10 is a diagram including photographs of the separation plane of the upper test piece and the separation plane of the lower test piece in Experimental Example 1.

FIG. 14A is a diagram including a photograph of the separation plane of the upper test piece in Experimental Example 3.

FIG. 14B is a diagram including a photograph of a cross-section of the upper test piece in Experimental Example 3.

FIG. 15A is a diagram including a photograph of the separation plane of the lower test piece in Experimental Example 3.

FIG. 15B is a diagram including a photograph of a cross-section of the lower test piece in Experimental Example 3.

DESCRIPTION OF EMBODIMENTS

Figure 1A:
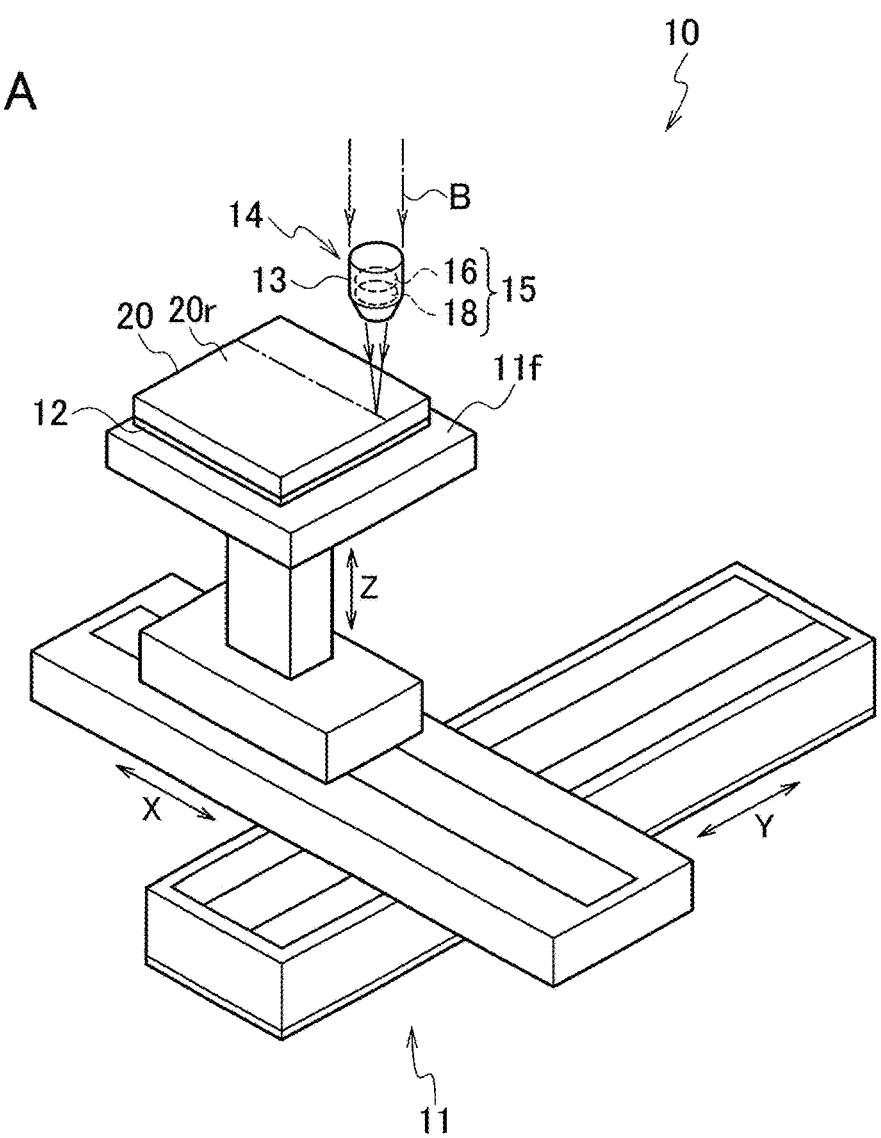
FIG. 1A is a schematic perspective view of a peeled substrate manufacturing apparatus used in an embodiment of the present disclosure.

Hereinafter, a description will be given of embodiments of the present disclosure with reference to the accompanying drawings. In the following description, the same or similar reference numerals are assigned to the same constituents as or similar constituents to those already described, and a detailed description thereof is omitted as appropriate. Moreover, the embodiments shown below are exemplifications for embodying the technical idea of this disclosure, and the embodiments of this disclosure do not specify materials, shapes, structures, dispositions and the like of constituent components to those described below. The embodiments of this disclosure can be implemented while being changed in various ways within the scope without departing from the spirit.

Figure 1B:
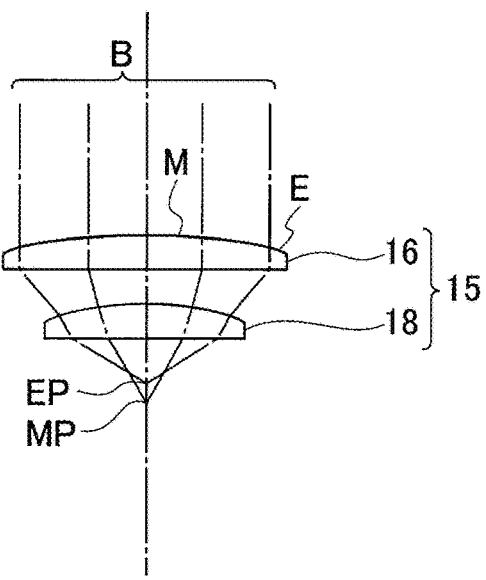
FIG. 1B is a partial enlarged side view of the peeled substrate manufacturing apparatus used in an embodiment of the present disclosure.
Figure 2A:
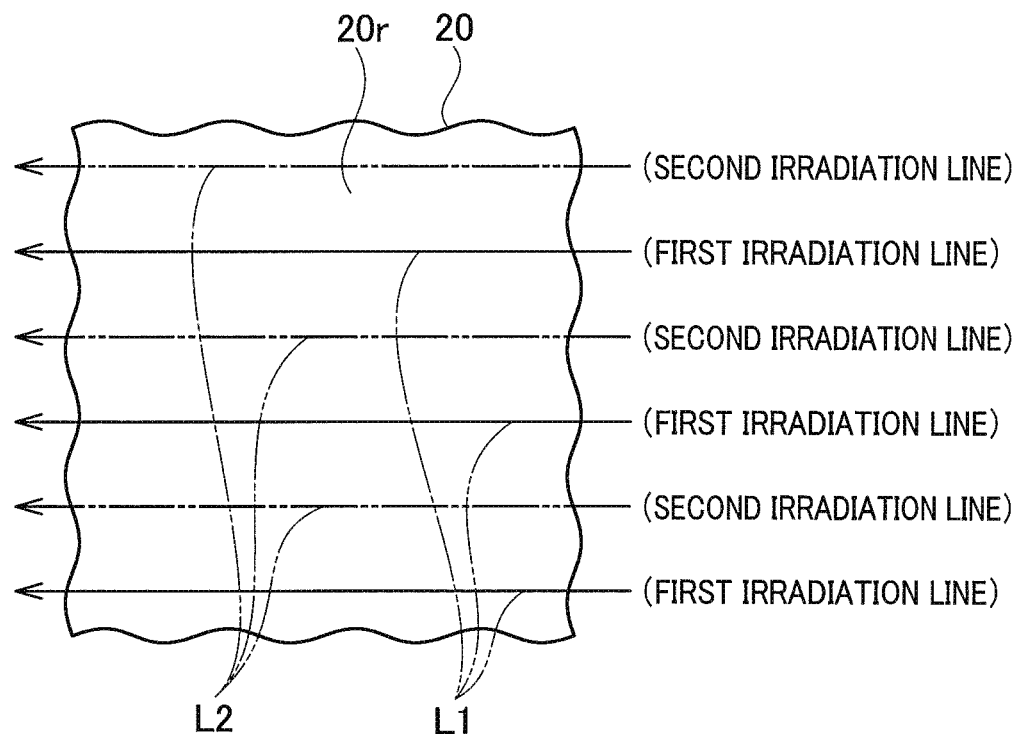
FIG. 2A is a schematic plan view illustrating a laser irradiation procedure in the embodiment of the present disclosure.
Figure 2B:
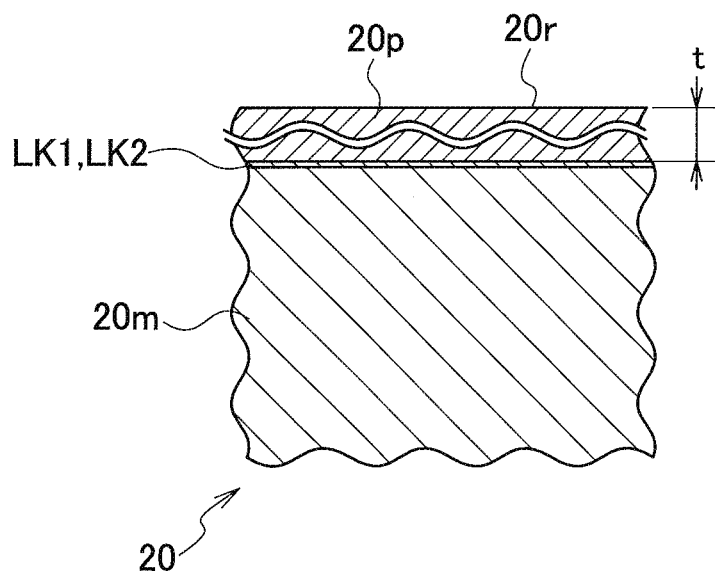
FIG. 2B is a schematic partial side cross-sectional view illustrating a magnesium oxide single crystal substrate irradiated with a laser beam.

FIG. 1A is a schematic perspective view of a substrate manufacturing apparatus used in an embodiment (hereinafter, referred to as the embodiment) of the present disclosure, and FIG. 1B is a partial enlarged side view of the substrate manufacturing apparatus used in the embodiment. FIG. 2A is a schematic plan view illustrating a laser irradiation procedure in the embodiment, and FIG. 2B is a schematic partial side cross-sectional view illustrating a magnesium oxide single crystal substrate irradiated with a laser beam.

In the embodiment, a peeled substrate is obtained from a magnesium oxide single crystal substrate (MgO substrate) using a substrate manufacturing apparatus 10 (see FIGS. 1A and 1B).

The substrate manufacturing apparatus 10 includes: a substrate placement member 12 (a silicon substrate, for example) held on a stage surface 11*f* of an XY stage 11; and a condenser 14 (a laser condensing means) that condenses a laser beam B to a magnesium oxide single crystal substrate 20 placed on the substrate placement member 12. In FIG. 1A, the magnesium oxide single crystal substrate 20 is rectangular in a plan view. However, the single crystal substrate 20 may be wafer-shaped. The shape of the single crystal substrate 20 can be determined freely.

The XY stage 11 is configured to be capable of adjusting a height position (Z-axis direction position) of the stage surface 11*f*, in which a distance between the stage surface 11*f* and the condenser 14 is made adjustable, that is, a distance between the single crystal substrate on the stage surface 11*f* and the condenser 14 is made adjustable. The XY stage 11 is also configured to be capable of adjusting positions in the X-Y plane.

In this embodiment, the condenser 14 includes: a correction ring 13; and a condenser lens 15 held in the correction ring 13. The condenser 14 has a function to correct an aberration allowed by a refractive index of the single crystal substrate 20 made of magnesium oxide, that is, a function as an aberration correction ring. Specifically, as shown in FIG. 1B, when condensing the laser beam B in the air, the condenser lens 15 corrects the laser beam B so that such a laser beam B that has reached an outer peripheral portion E of the condenser lens 15 is condensed closer to the condenser lens 15 than such a laser beam B that has reached a center portion M of the condenser lens 15 is. That is, in the case of the beam condensation, the laser beam B is corrected so that a condensing point EP of the laser beam B that has reached the outer peripheral portion E of the condenser lens 15 is located at a position closer to the condenser lens 15 than a condensing point MP of the laser beam B that has reached the center portion M of the condenser lens 15 is.

This condenser lens 15 is composed of: a first lens 16 that condenses the laser beam B in the air; and a second lens 18 disposed between this first lens 16 and the single crystal substrate 20. In this embodiment, each of the first lens 16 and the second lens 18 is defined as a lens capable of condensing the laser beam B in a conical shape. Then, a rotational position of the correction ring 13 is adjusted, that is, an interval between the first lens 16 and the second lens 18 is adjusted, whereby it is made possible to adjust an interval between the condensing point EP and the condensing point MP. The condenser 14 has a function as a correction ring-attached lens.

As the first lens 16, besides a spherical or aspherical single lens, a set of lens is usable for the purpose of a variety of aberration corrections and of ensuring a working distance.

Substrate Manufacturing Method

Hereinafter, a description is given of an example of manufacturing a thin magnesium oxide single crystal substrate from a magnesium oxide single crystal substrate with reference to the accompanying drawings.

In the embodiment, a first step is performed to dispose the condenser 14 on an irradiated surface 20r of the magnesium oxide single crystal substrate 20 (hereinafter, just referred to as a single crystal substrate 20) that contains few lattice defects. The condenser 14 is not in contact with the single crystal substrate 20. In a not-illustrated diamond substrate which is formed using a magnesium oxide substrate as the base substrate, the laser beam is irradiated to the magnesium oxide substrate side to separate a magnesium oxide substrate while leaving another thin magnesium oxide substrate on the diamond substrate.

After the first step, a second step is performed. In the second step, using the condenser 14, the laser beam B is irradiated on a first irradiation line L1 in the surface of the single crystal substrate 20 under designated irradiation conditions. The laser beam B is condensed into an inner portion of the single crystal substrate 20 while the condenser 14 and the single crystal substrate 20 are moved relative to each other in a two-dimensional manner (XY plane), thus forming processing mark lines LK1 in parallel (see FIGS. 2A and 4A, for example). Each processing mark line LK1 includes processing marks K1 formed in a line within the single crystal member. In this embodiment, the processing marks K1 and later-described processing marks K2 (see FIG. 4A, for example) are mainly formed by thermal processing.

Herein, the processing marks in this specification are an idea including a range of the component of the single crystal substrate scattered from the beam condensing position due to condensing of a laser beam. Planar separation in this specification is an idea also including a state where the substrate is likely to be separated with very small force although not actually separated.

After the second step, a third step is performed. In the third step, using the condenser 14, the laser beam B is irradiated to the surface of the single crystal substrate 20 under designated irradiation conditions. The laser beam B is condensed into an inner portion of the single crystal substrate 20 while the condenser 14 and the single crystal substrate 20 are moved relative to each other in a two-dimensional manner, thus forming processing mark lines LK2 between the adjacent irradiation lines L1 at irradiation in the second step (that is, between the processing mark lines LK1 adjacent to each other). This allows planar separation.

In the second step, the processing mark lines LK1 are formed along the first irradiation lines L1. In the third step, the processing mark lines LK2 are then formed between the first irradiation lines L1 adjacent to each other. Forming the processing mark lines LK2 in the third step naturally allows planar separation, forming a peeled substrate 20p on the irradiated surface side.

In the second and third steps, the relative distance between the condenser 14 and the single crystal substrate 20 is previously set based on the thickness of the peeled substrate 20p to be manufactured by planar separation (see FIG. 2B) so that the focal point is located at a designated height position, that is, the focal point is located at a designated depth position from the irradiated surface 20r of the single crystal substrate 20.

In this embodiment, the processing marks by the second step are formed in both substrate sections (upper and lower substrate sections) divided by the planar separation. In the embodiment, the second step forms a structure where the laser beam irradiated in the third step is reflected on the separation plane. The processed layer formed around the processing marks in the second step constitutes the structure reflecting the irradiated laser beam in the third step. In other words, the second step forms a laser beam reflection layer (a reflection layer R illustrated in FIG. 9 described later, for example).

Figures 4A, 4B:
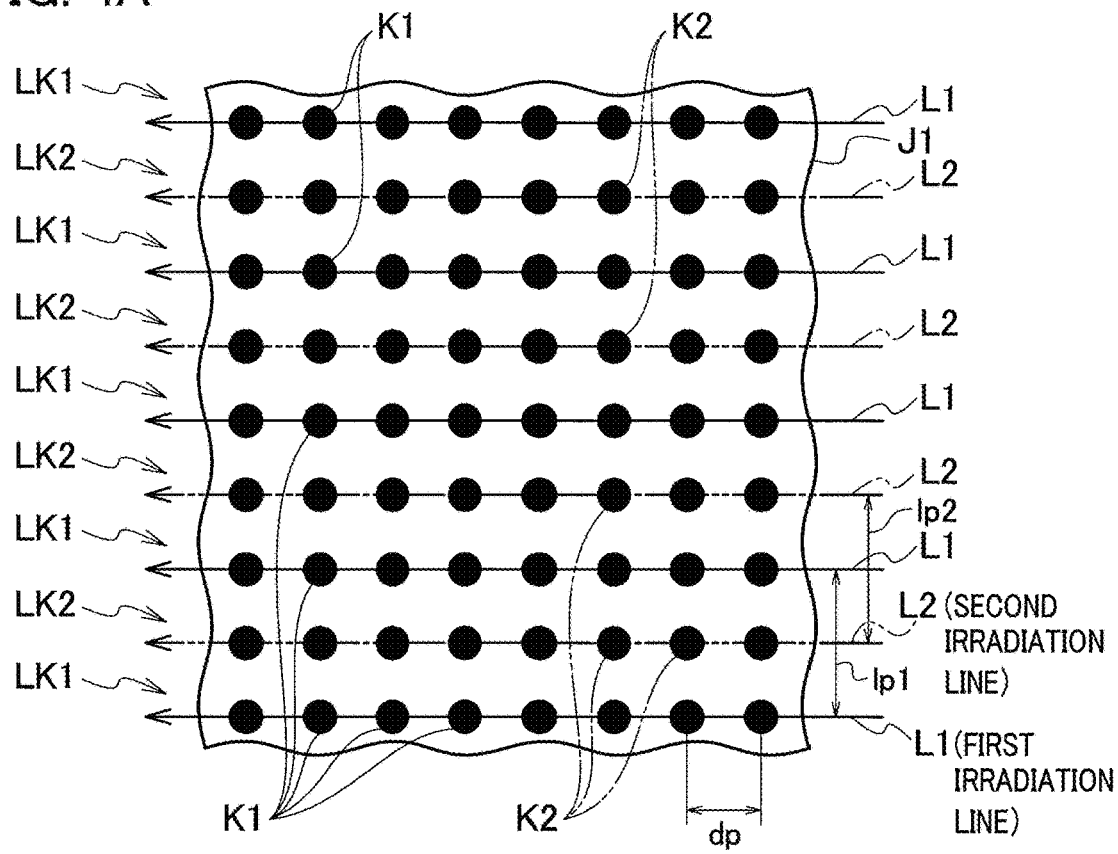
FIG. 4A is a schematic diagram illustrating laser irradiation in Experimental Example 1.
FIG. 4B is an explanatory diagram illustrating laser irradiation conditions.
Figure 5:
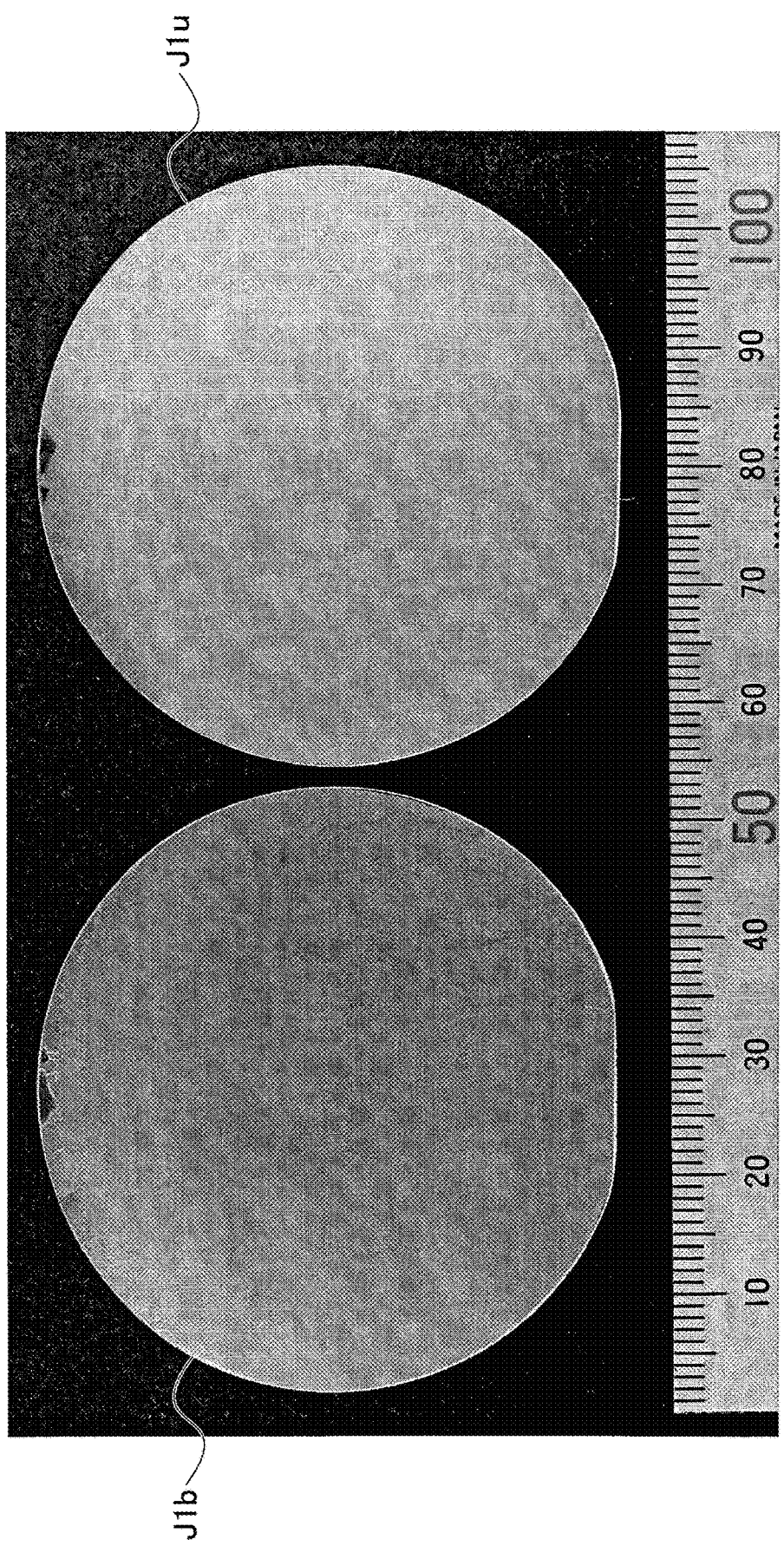
FIG. 5 is a diagram including a photograph of separation planes exposed by separating a test piece in Experimental Example 1.

The irradiation positions in the third step are set in a region where the processed layer formed in the second step exists. In this case, as illustrated in FIG. 4A, the irradiation positions are preferably arrayed accurately between offsets.

The designated irradiation conditions of the laser beam B in the third step are previously set so that the laser beam B is reflected on the reflection layer in the third step to naturally allow planar separation. In the setting of the designated irradiation conditions, various values are set, including the wavelength of the laser beam B to be irradiated, aberration correction (defocusing value) of the condenser lens 15, laser output power, dot pitch dp of the processing marks K1 and K2 (see FIG. 4A, for example; distance between adjacent processing marks in the same processing mark line), and line pitches lp1 and lp2 (see FIGS. 2A and 4A; offset pitches; distances between adjacent processing mark lines in each process), in the light of the properties (crystalline structure and the like) of the single crystal substrate 20, thickness t of the peeled substrate 20p to be formed (see FIG. 2B), energy density of the laser beam B at the focal point, and the like. The obtained peeled substrate 20p is then subjected to posttreatment, including polishing of the separation plane, if necessary.

According to the embodiment, it is possible to easily obtain a thin magnesium oxide single crystal substrate. Furthermore, since the thin magnesium oxide single crystal substrate is obtained by separation from the single crystal substrate 20 containing few lattice defects, the obtained thin magnesium oxide single crystal substrate contains few lattice defects.

The reflection layers of the processing marks K1 in adjacent irradiation lines may overlap each other. This increases the flexibility of irradiation positions of the laser beam in the third step.

Figure 9:
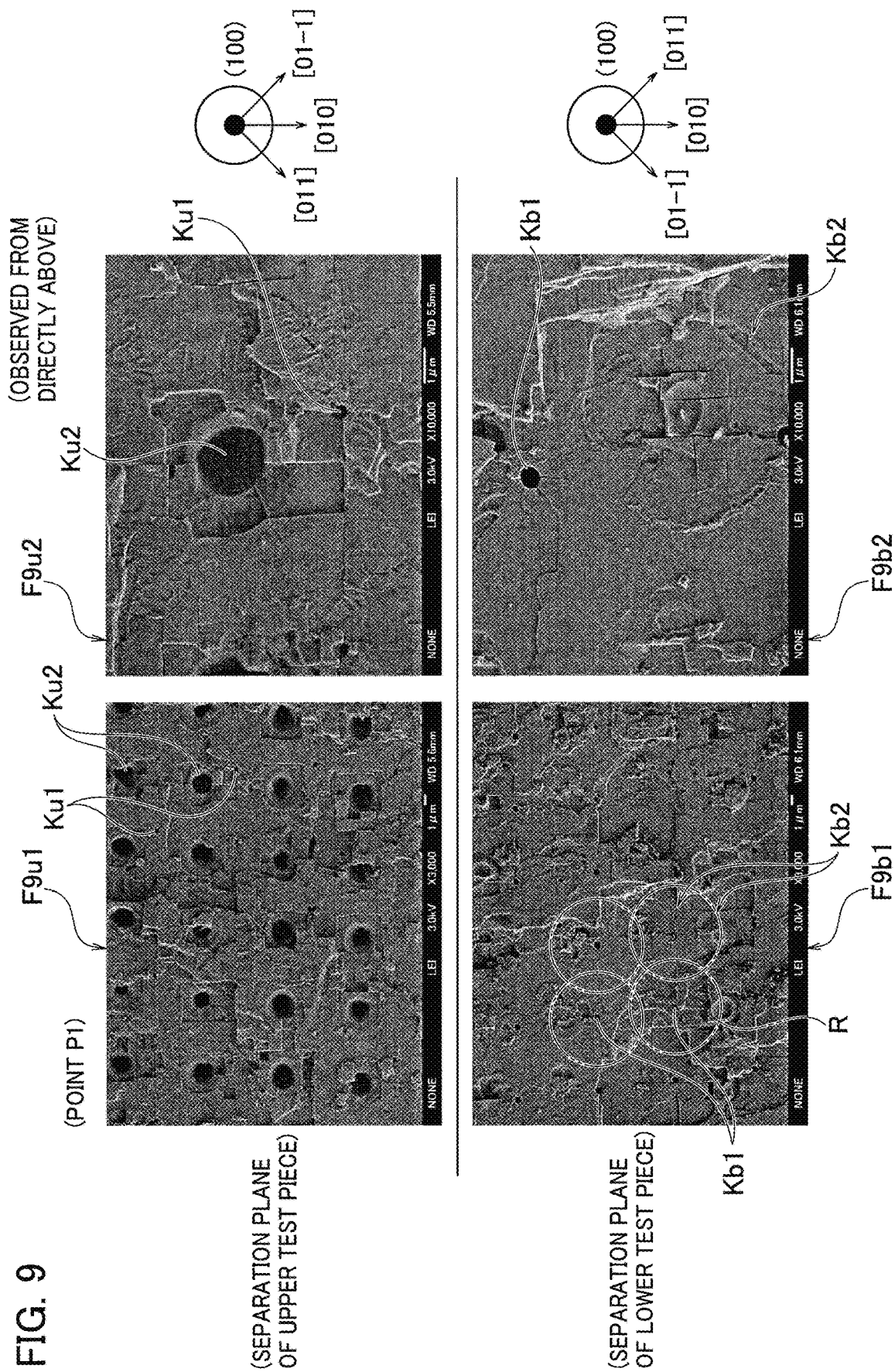
FIG. 9 is a diagram including photographs of the separation plane of an upper test piece and the separation plane of a lower test piece in Experimental Example 1.

Furthermore, the reflection layers of the processing marks K1 adjacent to each other in the scanning direction of the layer beam may overlap each other (see FIG. 9, for example). This facilitates forming the reflection layers substantially across the entire surface between the adjacent irradiation lines formed in the second step.

In addition, the single crystal substrate 20 is used as a magnesium oxide single crystal member, and peeled substrates 20p of the same dimensions are sequentially separated. This can sufficiently increase the use efficiency of the magnesium oxide single crystal member (sufficiently prevent production of swarf of magnesium oxide).

Since the scanning direction of the laser beam is set to a direction along the crystal orientation of the single crystal substrate 20, laser irradiation that naturally allows planar separation is easily implemented.

In the embodiment, the laser beam B is preferably high-intensity laser beam. The high-intensity laser beam in the present disclosure is specified by peak power (pulse energy divided by pulse width) and power density (energy per unit time per unit area). Generally, a high-power laser can be used to increase the power density. In the embodiment, irradiation of the laser beam B with a high power exceeding 1 kW, for example, is more likely to damage the substrate being processed and makes it difficult to form intended thin processing marks. The high-intensity laser beam employed in the embodiment is therefore preferably a short pulse-duration laser beam emitted at low output power so as not to damage the substrate being processed.

To further increase the power density, the laser beam B is preferably a laser beam with a shorter pulse duration (a laser beam with a pulse duration of 10 ns or less, desirably 100 ps or less, or more desirably 15 ps or less, for example). The employment of such a laser beam with a short pulse duration significantly facilitates increasing the power density of the high-intensity laser beam.

In this embodiment, aberration correction can be adjusted with the correction ring 13 and condenser lens 15. In the second step, the defocusing value can be set through adjustment of aberration correction. This can expand the range of the aforementioned designated irradiation conditions. By using the defocusing value, it is possible to select the means of adjusting the depth of processing marks to be formed and the conditions to form thin processing marks according to the thickness of the substrate to be processed and the thickness of the substrate to be separated. When the magnesium oxide substrate to be processed is 200 to 300 μm thick, setting the defocusing value in the range from 30 to 120 μm can effectively expand the range of the designated irradiation conditions.

In the embodiment, the laser irradiation is separately performed in the aforementioned second and third steps. This can prevent occurrence of a large cleavage that protrudes from the processing mark lines formed in each process. In addition, the laser irradiation reliably connects only the processing mark lines adjacent to each other, thus facilitating separation of the substrate. This provides a separation plane excellent in surface conditions.

In the process of extracting the peeled substrate 20p, which has been subjected to planar separation, from the single crystal substrate 20, an abutment member that is able to come into plane contact with the peeled substrate 20p may be brought into plane contact with the peeled substrate 20p to be extracted. If a member to which the peeled substrate 20p is intended to be attached is used as the abutment member, the attachment process is shortened. Furthermore, when the edge of the peeled substrate 20p is not completely separated from the single crystal substrate 20, the attachment member allows the peeled substrate 20p to be separated and extracted from the edge while preventing cracks from occurring in the peeled substrate 20p. In the light of facilitating natural separation without doing anything after laser irradiation, it is preferable to implement a state where the strength for separation is not higher than 2 MPa and more preferably not higher than 1.0 MPa.

In the example described in the embodiment, the substrate placement member 12 is held on the XY stage 11, and the single crystal substrate 20 is placed thereon for irradiation with the laser beam B. However, the single crystal substrate 20 may be directly placed and held on the XY stage 11 so that the processing marks K1 and K2 are formed with the laser beam B.

In the example described in the embodiment, the peeled substrate 20p is obtained from the single crystal substrate 20 (the magnesium oxide single crystal substrate). However, the peeled substrate 20p may be obtained by causing planar separation of a single crystal member, not limited to the single crystal substrate 20, of magnesium oxide on the side of the irradiated surface 20r.

Experimental Example 1

Figure 3:
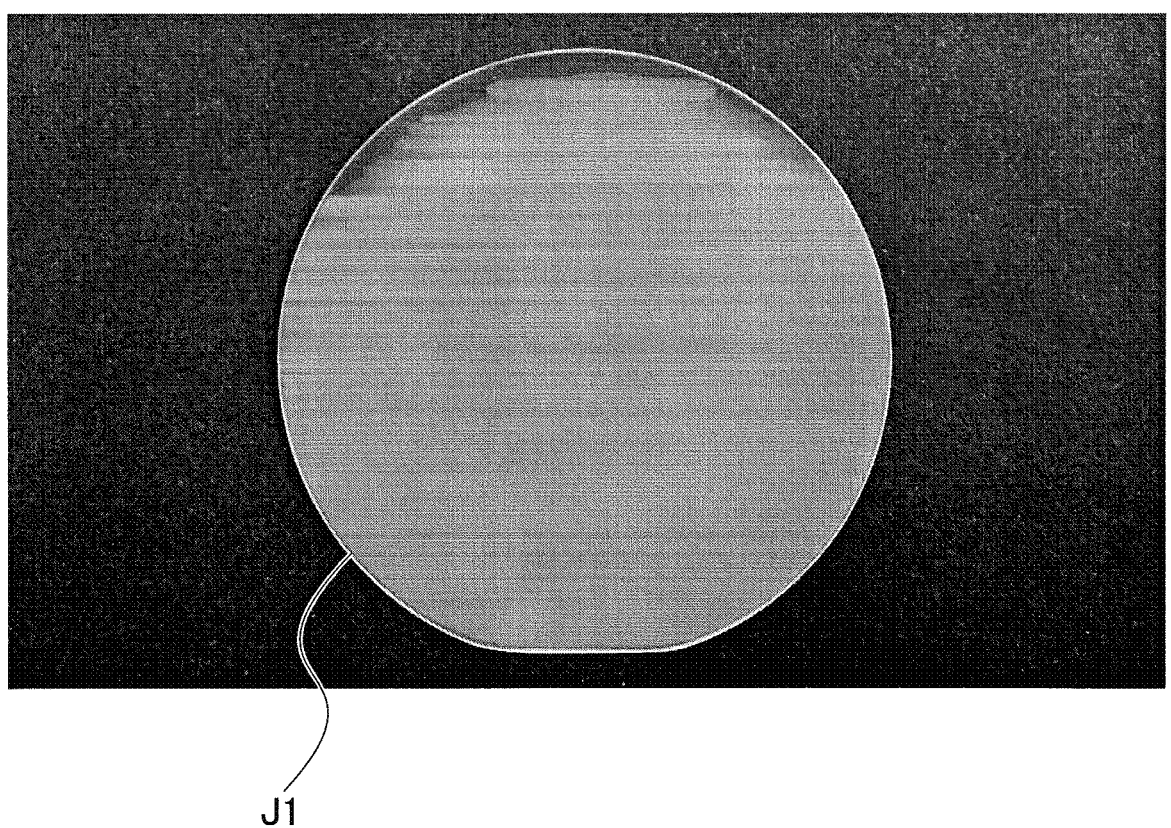
FIG. 3 is a diagram including a photograph of a single crystal oxide magnesium wafer before separation in Experimental Example 1.

The inventor used a single crystal magnesium oxide wafer (see FIG. 3; referred to as a test piece J1 hereinafter) with a diameter of 2 inches and a thickness of 300 micrometers as illustrated in FIG. 3.

(1) Irradiation Conditions

In Experimental Example 1, the aforementioned first to third steps were performed using the substrate manufacturing apparatus 10 described in the aforementioned embodiment. In the second step, as illustrated in FIG. 4A, the processing marks K1 were formed in the test pieces J1 with the designated dot pitch dp and line pitch lp1. In the third step, the processing marks K2 were formed in the test piece J1 with the designated dot pitch dp and line pitch lp2 as illustrated in FIG. 4A. This resulted in formation of a reformed layer including the processing mark lines LK1 and LK2 arrayed. In this laser irradiation, the diameter of the laser beam B at the incidence into the condenser lens 15 was 3000 μm; the focal distance of the condenser lens 15, 1200 μm; and the depth of the focal point from the substrate surface, within 150 μm±10 μm. The other irradiation conditions of the laser beam are illustrated in FIG. 4B.

(2) Separation Plane

FIG. 3 is a plan view of the test piece J1 already subjected to the third step, before separation. For easy determination of the processing condition, part of the test piece J1 at the top of the drawing was left not processed sufficiently on purpose. The other part is processed evenly.

After laser irradiation in the third step, the irradiated surface side (the upper side) of the test piece J1 was sandwiched by aluminum bases with an adhesive interposed therebetween. The bases were both made of aluminum. Using an epoxy adhesive as the adhesive, one of the bases was bonded to the irradiated surface side (the upper side) of the test piece J1 while the other base was bonded to the bottom surface side (the lower side) of the test piece J1.

The both bases were pulled in the vertical direction, and force to tear the teat piece J1 at the reformed layer (the layer in which the processing mark lines LK1 and LK2 were formed) was measured, for calculation of tensile fracture stress needed to separate at the reformed layer, an upper test piece J1u, which includes the irradiated surface side (upper side) of the test piece J1, from a lower test piece J1b, which includes a bottom surface side (lower side) of the test piece J1. The upper and lower test pieces J1u and J1b were separated with a tensile stress of 6 MPa. The upper and lower test pieces J1u and J1b were separated at the reformed layer with a considerably smaller tensile facture stress than that of a single crystal silicon substrate, which is 12 MPa. Since the test piece J1, which included the part left not processed sufficiently at the top of the drawing on purpose, was divided with a tensile fracture stress of 6 MPa, the tensile fracture stress necessary for a fully-processed wafer to be divided will be smaller.

Figure 6:
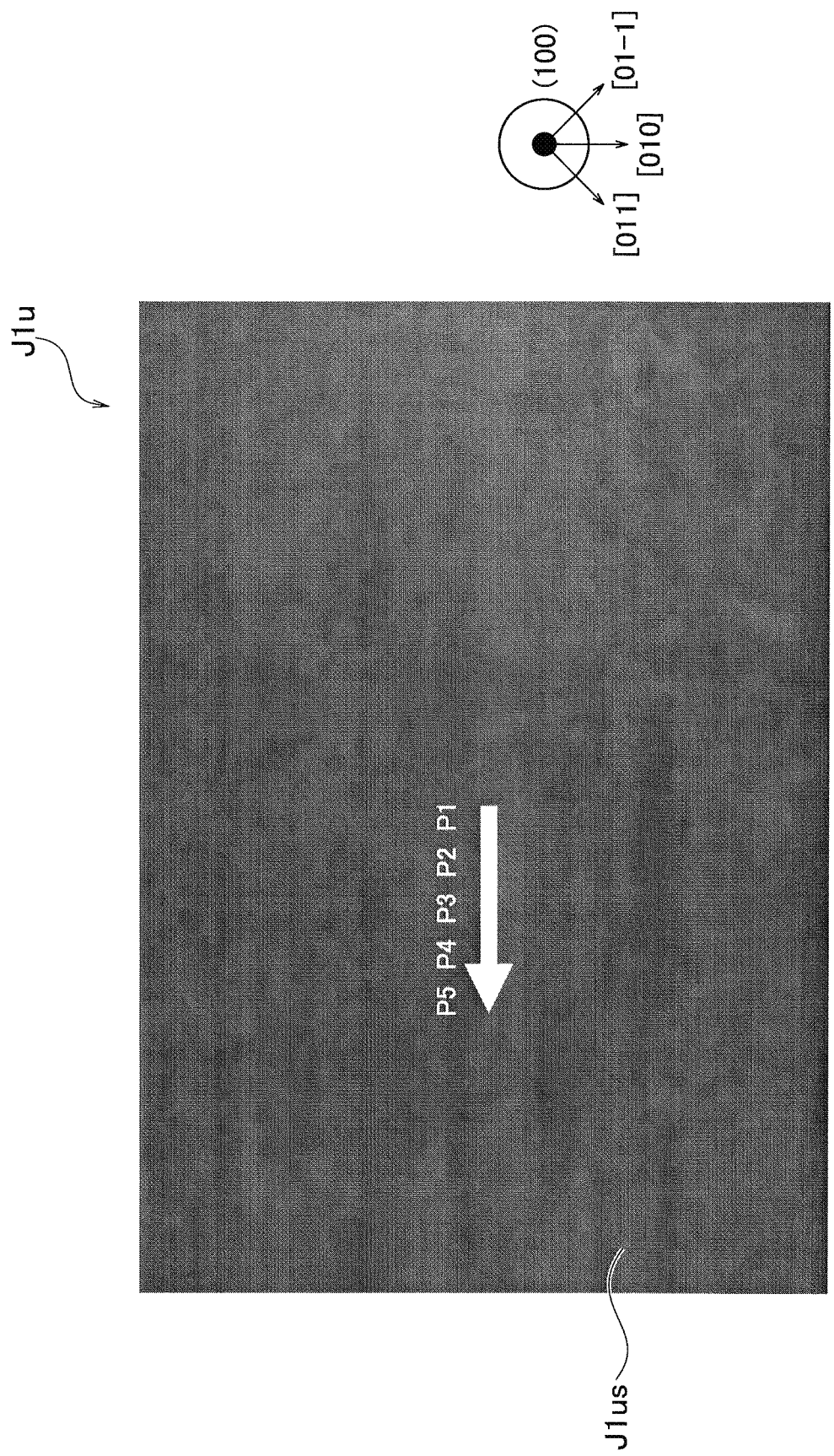
FIG. 6 is a diagram including a photograph illustrating P1 to P5 on the separation plane of the test piece in Experimental Example 1.
Figure 7:
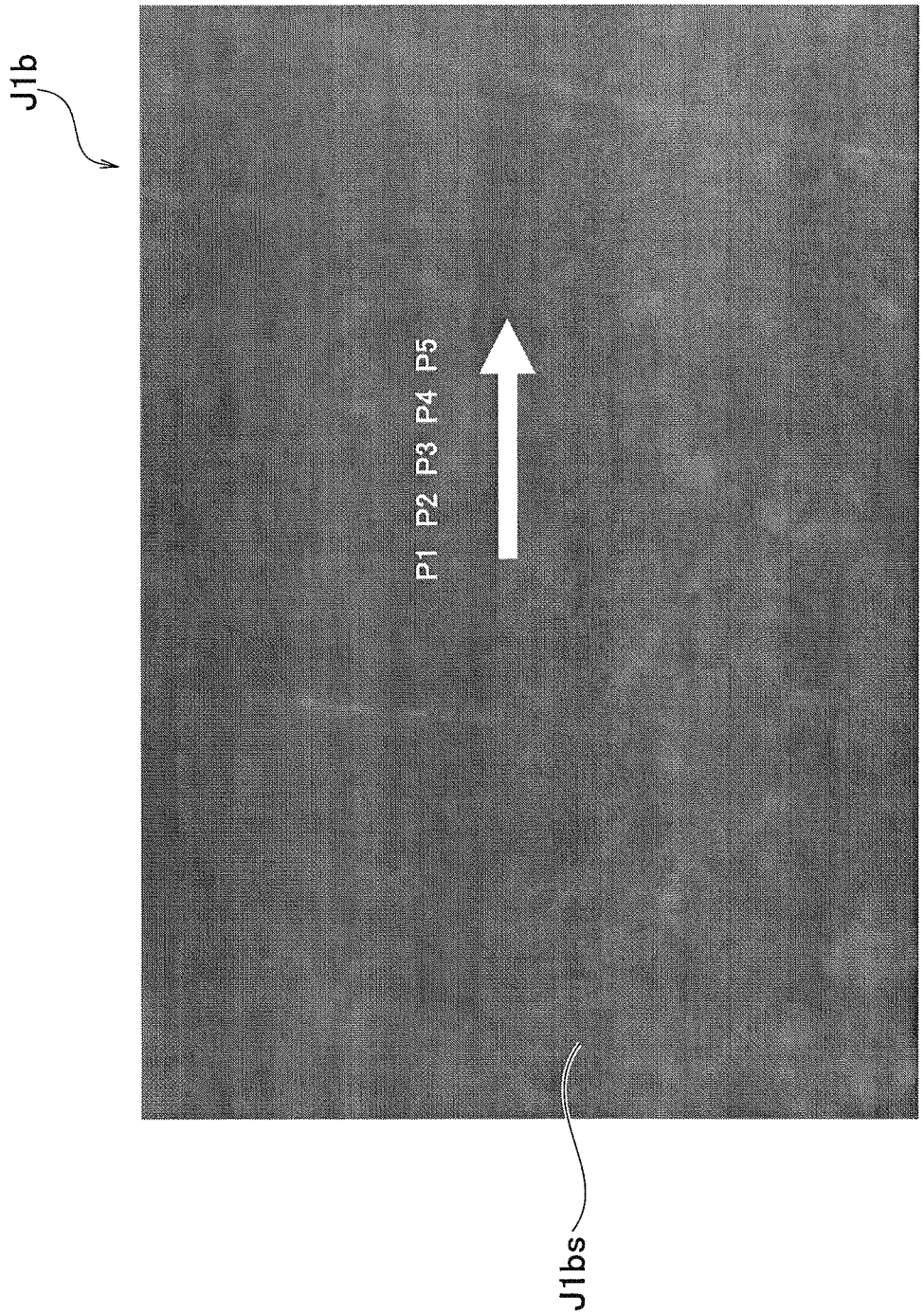
FIG. 7 is a diagram including a photograph illustrating P1 to P5 on the other separation plane of the test piece in Experimental Example 1.

Images of five regions of a separation plane J1us (see FIG. 6) of the upper test piece J1u were taken from above (from a plane) with a scanning electronic microscope (SEM) with the imaging position sequentially shifted from a substrate center point P1 to a point P5 on the same line by 500 μm. In a similar manner, images of five regions of a separation plane J1bs (see FIG. 7) of the lower test piece J1b were taken from above (from a plane) with a scanning electronic microscope (SEM) with the imaging position sequentially shifted from the substrate center P1 to the point P5 on the same line by 500 µm. The imaging results are shown in FIG. 8.

Figure 8:
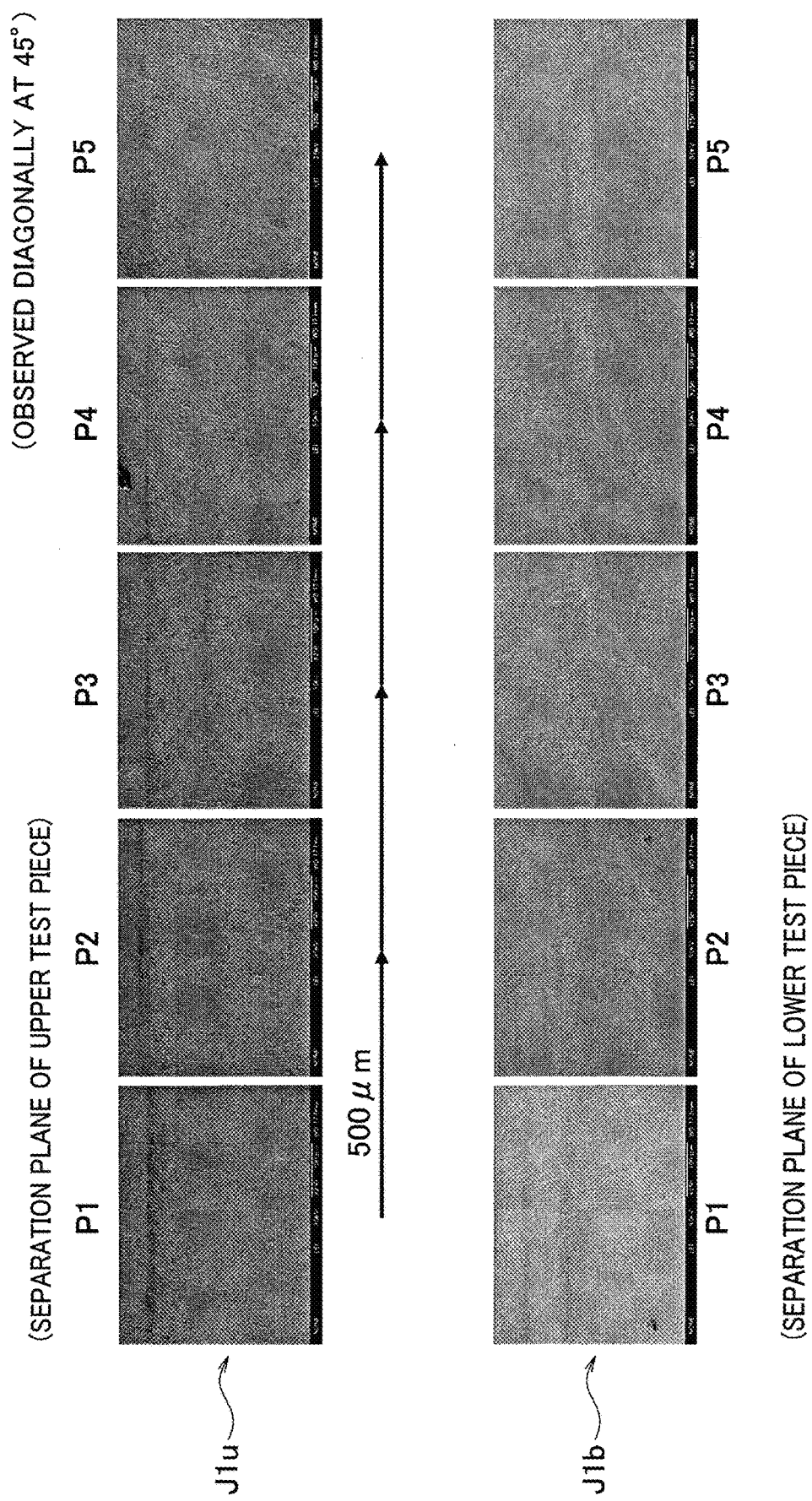
FIG. 8 is a diagram including photographs taken by sequentially shifting the imaging position on the separation planes of the test piece in Experimental Example 1.

In FIG. 8, horizontal lines indicate SEM charge-up and were not formed in the separation planes. The image diagram attached to the specification properly illustrates crystal orientation together.

The inventor took images of the separation plane J1$us$ of the upper test piece J1$u$ and the separation plane J1$bs$ of the lower test piece J1$b$ from above (from a plane) at the substrate center P1 with higher SEM magnification. The imaging results are shown in FIG. 9. In FIG. 9, F9$u$1 indicates a photograph diagram of the separation plane of the upper test piece J1$u$; and F9$u$2 indicates a partial enlarged view of F9$u$1. F9$b$1 indicates a photograph diagram of the separation plane of the lower test piece Jib; and F9$b$2 indicates a partial enlarged view of F9$b$1.

In F9$u$1, processing mark upper halves Ku1 due to the first laser irradiation (the second step) were formed. In F9$b$1, processing mark lower halves Kb1 due to the first laser irradiation (the second step) were formed at the positions corresponding to the respective processing mark upper halves Ku1. The processing mark upper halves Ku1 and processing mark lower halves Kb1 were of substantially equal dimensions. The processing marks K1 composed of the processing mark upper halves Ku1 and processing mark lower halves Kb1 are therefore considered to be elongated in the substrate thickness direction.

In F9$b$1, processing mark lower halves Kb2 due to the second laser irradiation (the third step) were formed in an array. In F9$u$1, processing mark upper halves Ku2 due to the second laser irradiation (the third step) were formed in an array at the positions corresponding to the respective processing mark lower halves Kb2. Each processing mark upper half Ku2 had a shape of a large-diameter hole opened due to the reflected laser beam. The processing mark lower halves Kb2 are formed into a dish-like recessed shape with the molten scattered substance from the processing mark upper halves Ku2. It is therefore thought that the separation plane of each processing mark lower half Kb2 was highly likely to be physically formed by scattering from above.

The inventor took images of the separation plane J1$us$ of the upper test piece J1$u$ and the separation plane J1$bs$ of the lower test piece J1$b$ diagonally at an angle of 45 degrees, at the substrate center point P1 in a similar manner. The imaging results are shown in FIG. 10. In FIG. 10, F10$u$1 indicates a photograph diagram of the separation plane of the upper test piece J1$u$; and F10$u$2 indicates a partial enlarged view of F10$u$1. F10$b$1 indicates a photograph diagram of the separation plane of the lower test piece J1$b$; and F10$b$2 indicates a partial enlarged view of F10$b$1. These photograph diagrams provide the same findings as those obtained from FIG. 9.

(3) Conclusion

After laser irradiation under the irradiation conditions of Experimental Example and separation of the upper and lower test pieces J1$u$ and J1$b$ provided a thin magnesium single crystal substrate that contains few lattice defects.

In the process of separation, the upper and lower test pieces J1$u$ and J1$b$ were separated at the reformed layer with a tensile fracture stress significantly smaller than that of a single crystal silicon substrate as described above. It is thought that planar separation occurred in the reformed layer.

Experimental Example 2

Figure 11:
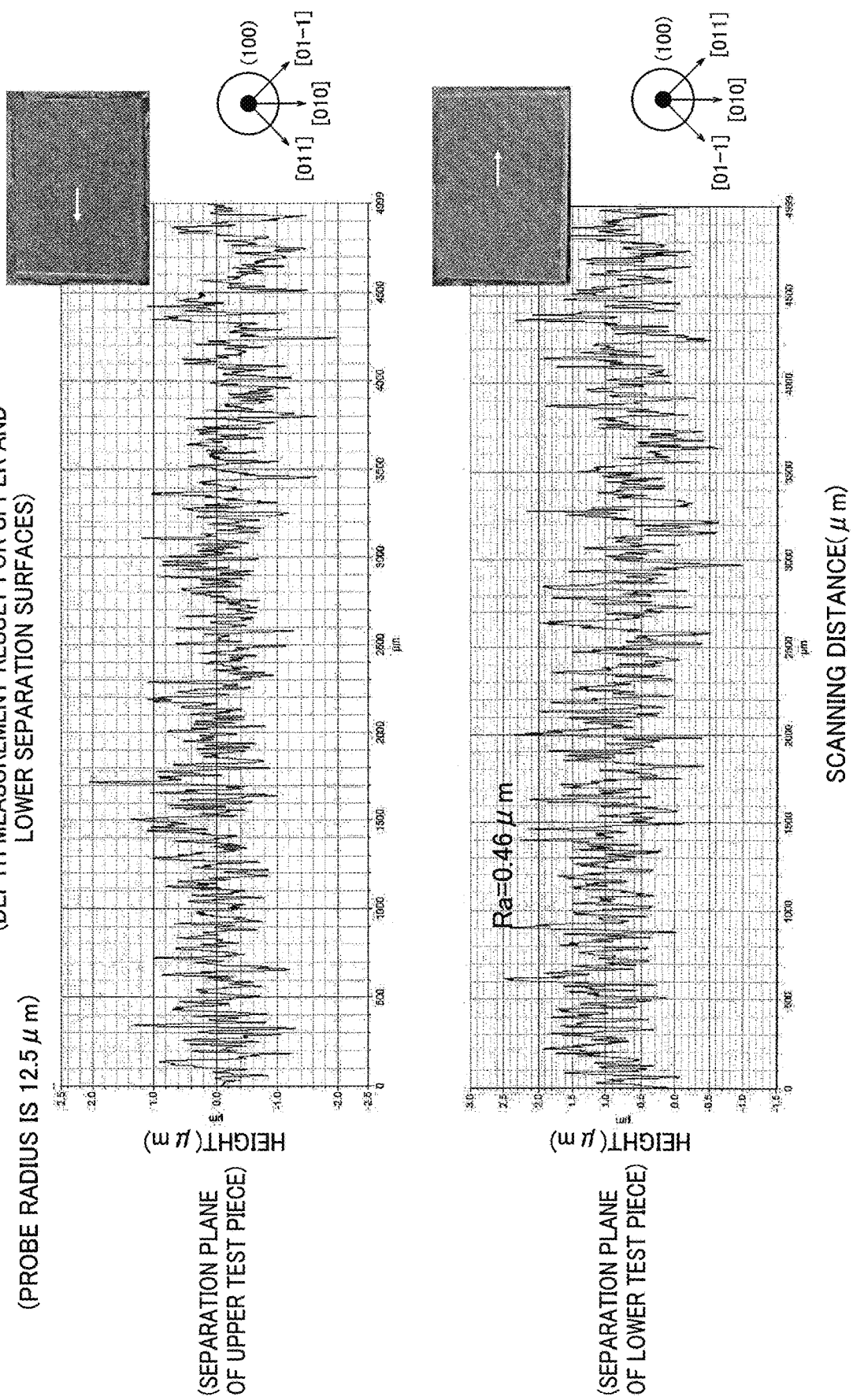
FIG. 11 is a chart diagram illustrating results of measuring surface roughness of the separation planes of the upper and lower test pieces in Experimental Example 2.

The inventor performed depth measurement at the points P1 to P5 in the separation plane J1$us$ of the upper test piece J1$u$ by using a surface roughness meter (probe diameter was 12.5 µm). The measurement results are illustrated in FIG. 11. The inventors performed depth measurement at the points P1 to P5 in the separation plane J1$bs$ of the lower test piece J1$b$ by using the surface roughness meter in a similar manner. The measurement results thereof are illustrated in FIG. 11 together. The measurement results showed that Ra was 0.46 µm.

Experimental Example 3

Figure 12A:
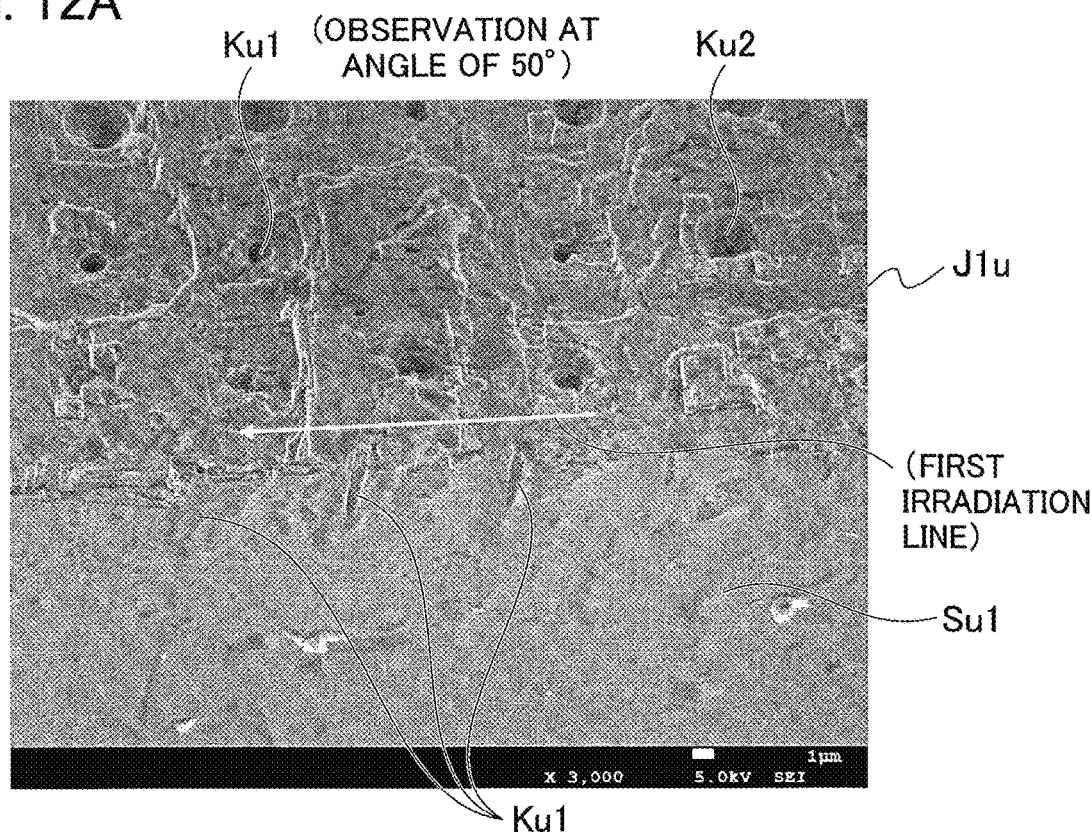
FIG. 12A is a diagram including a photograph of the separation plane of the upper test piece in Experimental Example 3.
Figure 12B:
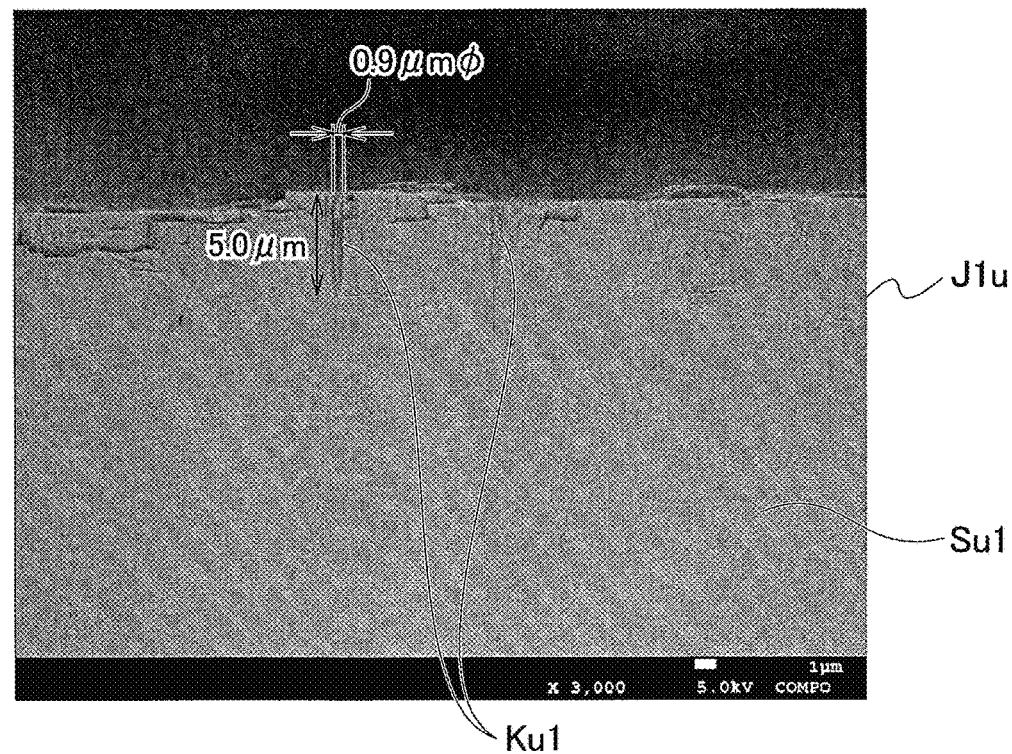
FIG. 12B is a diagram including a photograph of a cross-section of the upper test piece in Experimental Example 3.

The inventor observed a cross section Su1 passing through one of the processing mark upper halves Ku1 (a processing mark due to the first laser irradiation) of the upper test piece Hu using an SEM (see FIG. 12B). The processing mark upper half Ku1 of the upper test piece J1$u$ had a diameter of 0.9 µM and a depth of 5.0 µm.

Figure 13A:
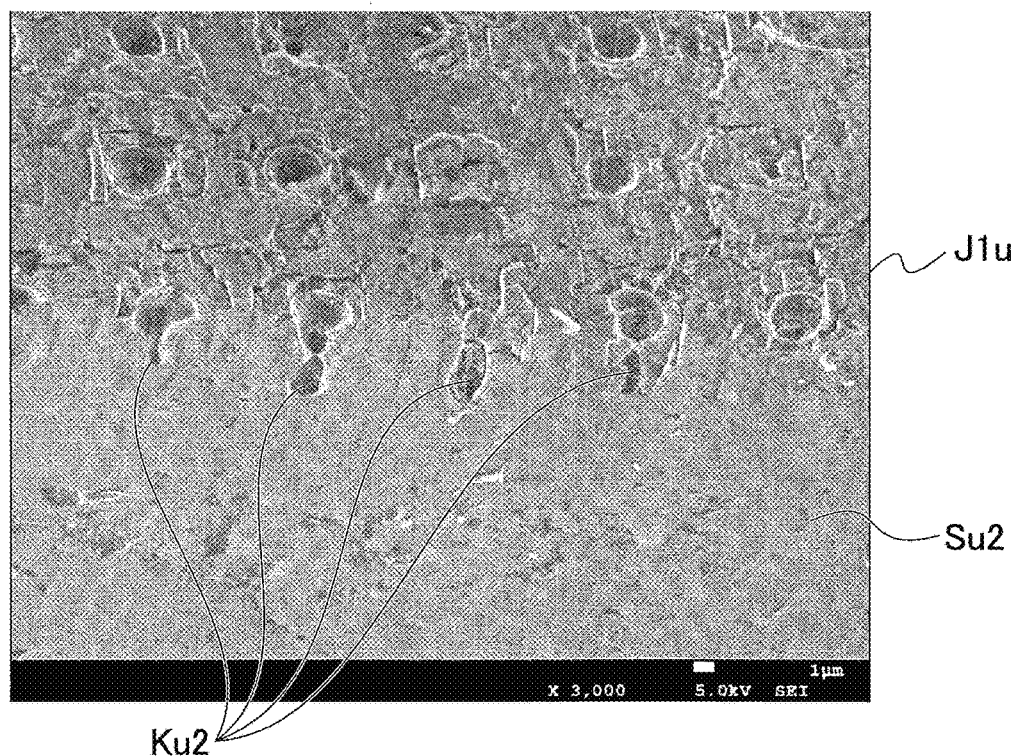
FIG. 13A is a diagram including a photograph of the separation plane of the upper test piece in Experimental Example 3.
Figure 13B:
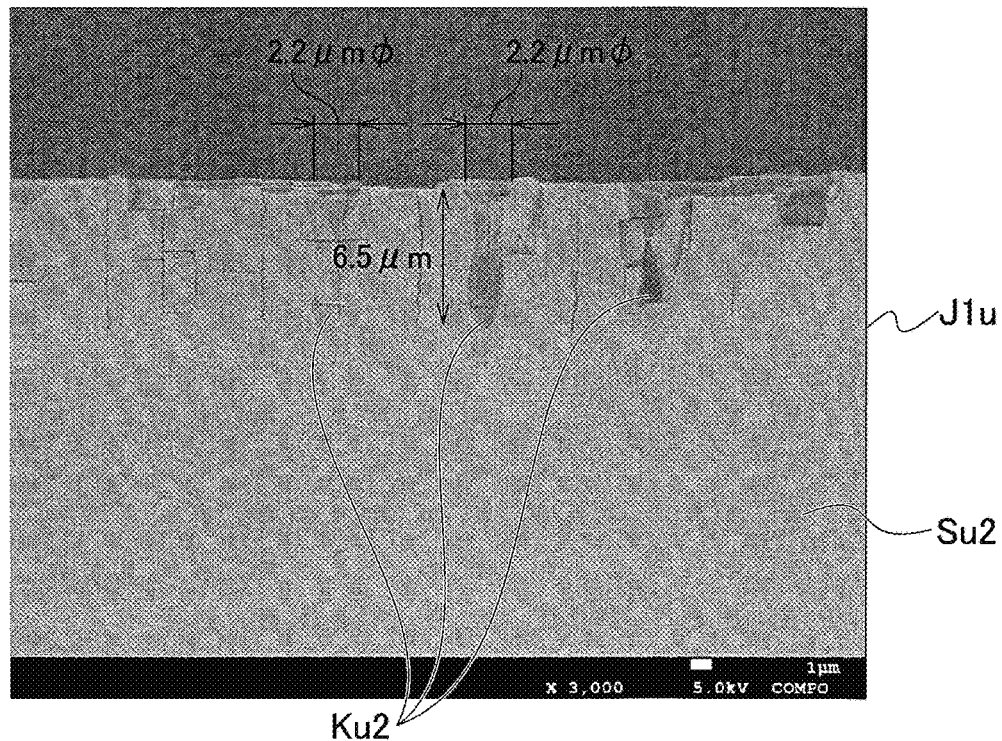
FIG. 13B is a diagram including a photograph of a cross-section of the upper test piece in Experimental Example 3.

The inventor observed a cross section Su2 passing through one of the processing mark upper halves Ku2 (a processing mark due to the second laser irradiation) of the upper test piece J1$u$ using an SEM (see FIG. 13B). The processing mark upper half Ku2 had a diameter of 2.2 to 2.8 µm and a depth of 6.5 µm.

The inventor observed a cross section passing through another processing mark upper half Ku2 (a processing mark due to the second laser irradiation) of the upper test piece J1$u$ using an SEM (see FIG. 14B). The processing mark upper half Ku2 had a diameter of 4.2 µm and a depth of 6.5 µm.

The inventor observed a cross section Sb1 passing through one of the processing mark lower halves Kb1 (a processing mark due to the first laser irradiation) of the lower test piece J1$b$ using an SEM (see FIG. 15B). The processing mark lower half Kb1 had a diameter of 0.8 µm and a depth of 12.7 µm.

Figure 16A:
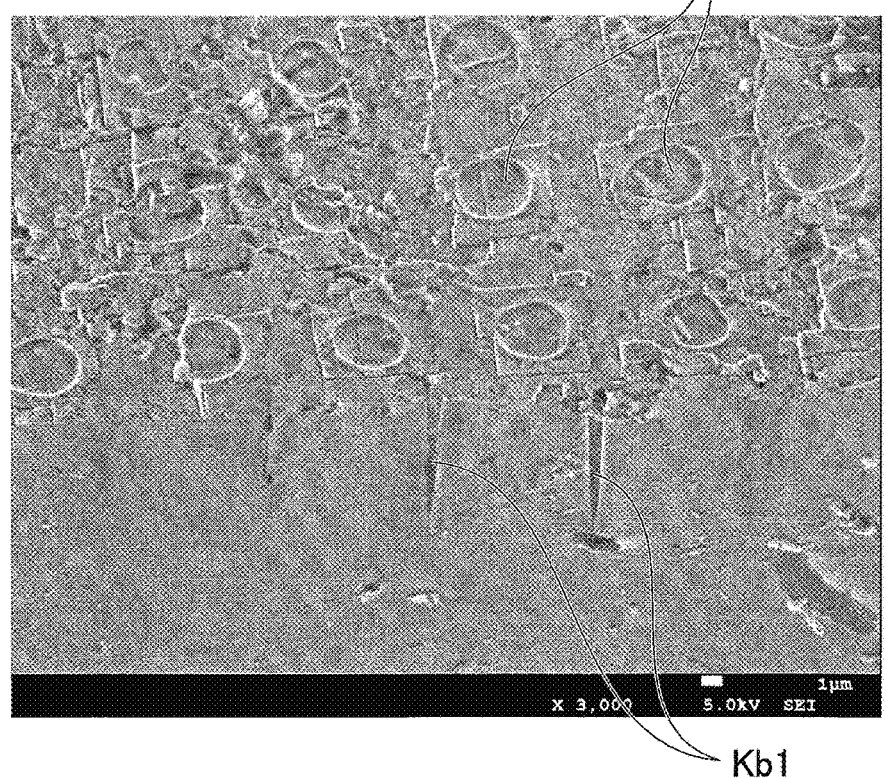
FIG. 16A is a diagram including a photograph of the separation plane of the lower test piece in Experimental Example 3.
Figure 16B:
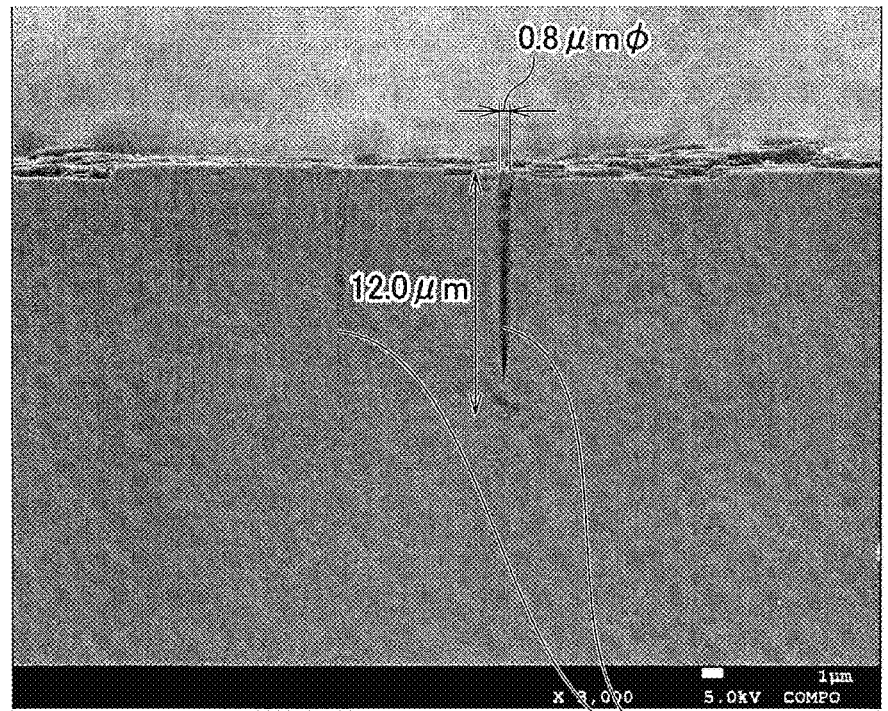
FIG. 16B is a diagram including a photograph of a cross-section of the lower test piece in Experimental Example 3.

The inventor observed a cross section passing through another processing mark lower half Kb1 (a processing mark due to the first laser irradiation) of the lower test piece J1$b$ using an SEM (see FIG. 16B). The processing mark lower half Kb1 had a diameter of 0.8 µm and a depth of 12.0 µm.

Figure 17A:
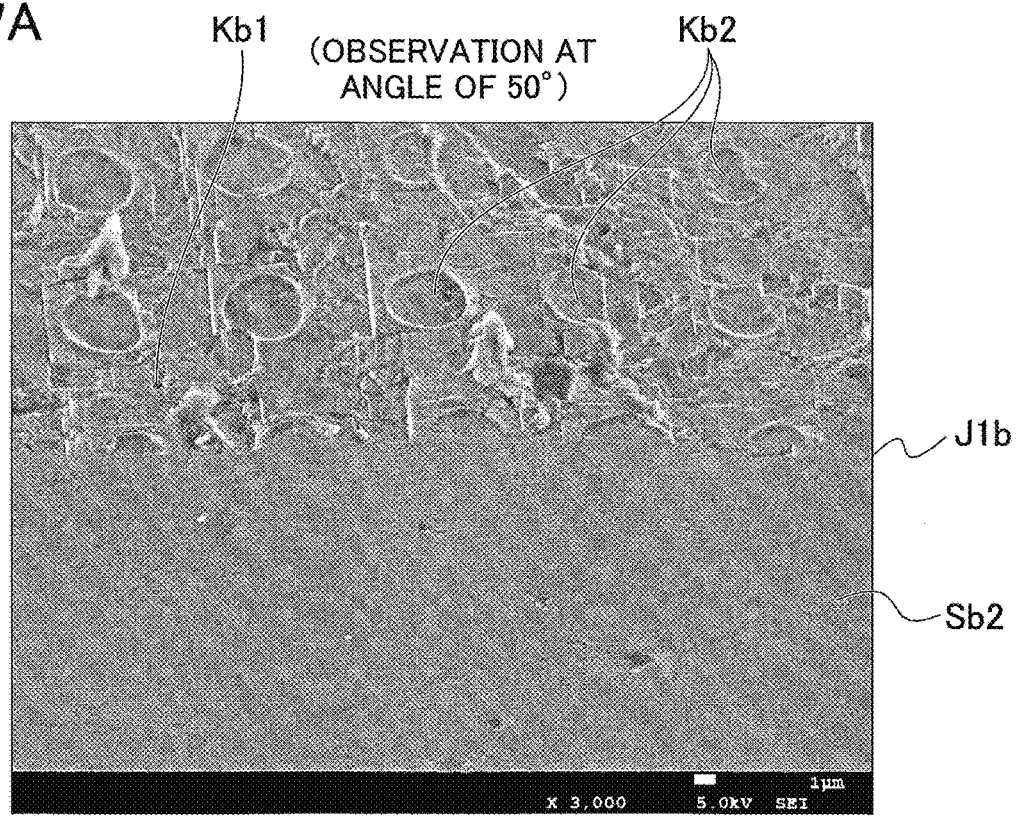
FIG. 17A is a diagram including a photograph of the separation plane of the lower test piece in Experimental Example 3.
Figure 17B:
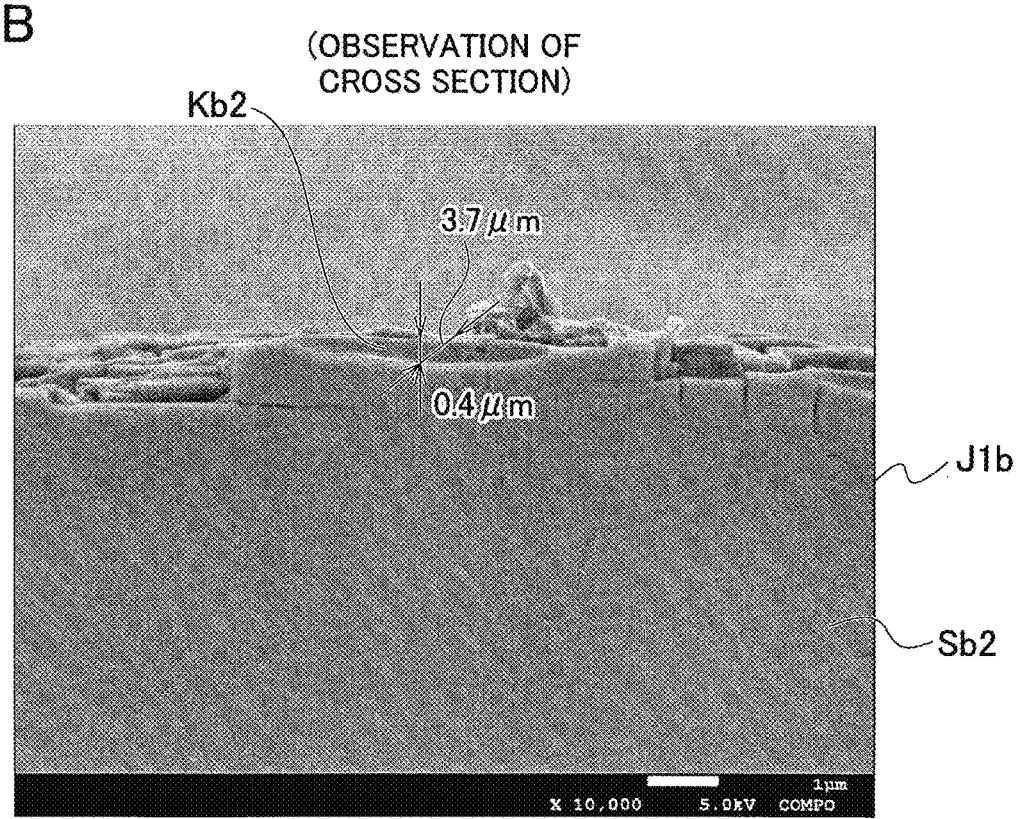
FIG. 17B is a diagram including a photograph of a cross-section of the lower test piece in Experimental Example 3.

The inventor observed a cross section Sb2 passing through one of the processing mark lower halves Kb2 (a processing mark due to the second laser irradiation) of the lower test piece J1$b$ using an SEM (see FIG. 17B). The processing mark lower half of the lower test piece J1$b$ had a diameter of 3.7 µm and a depth of 0.4 µm.

Figure 18:
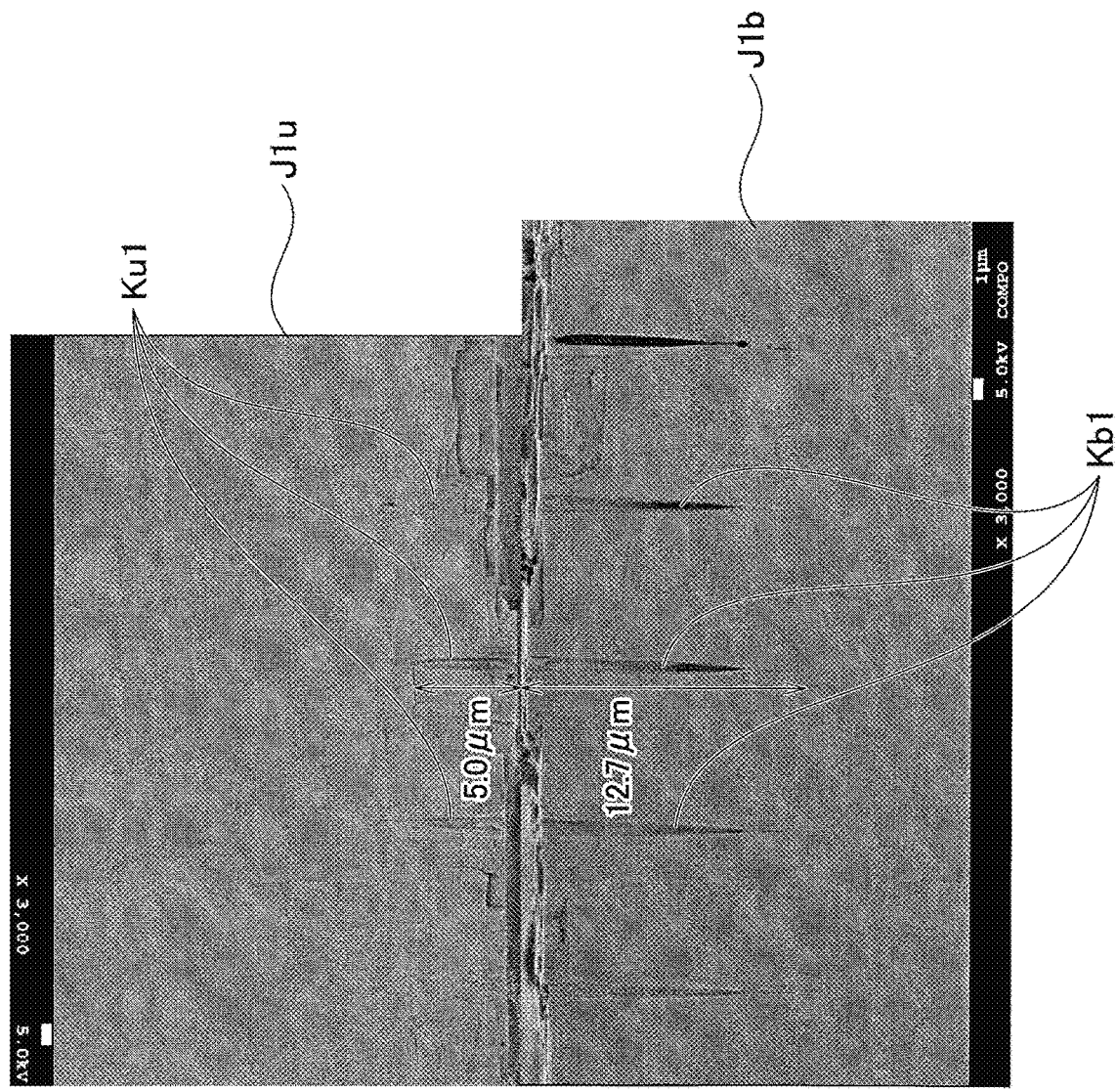
FIG. 18 is a photograph diagram for examination of the relative positions of the upper and lower test pieces in Experimental Example 3.
Figure 19:
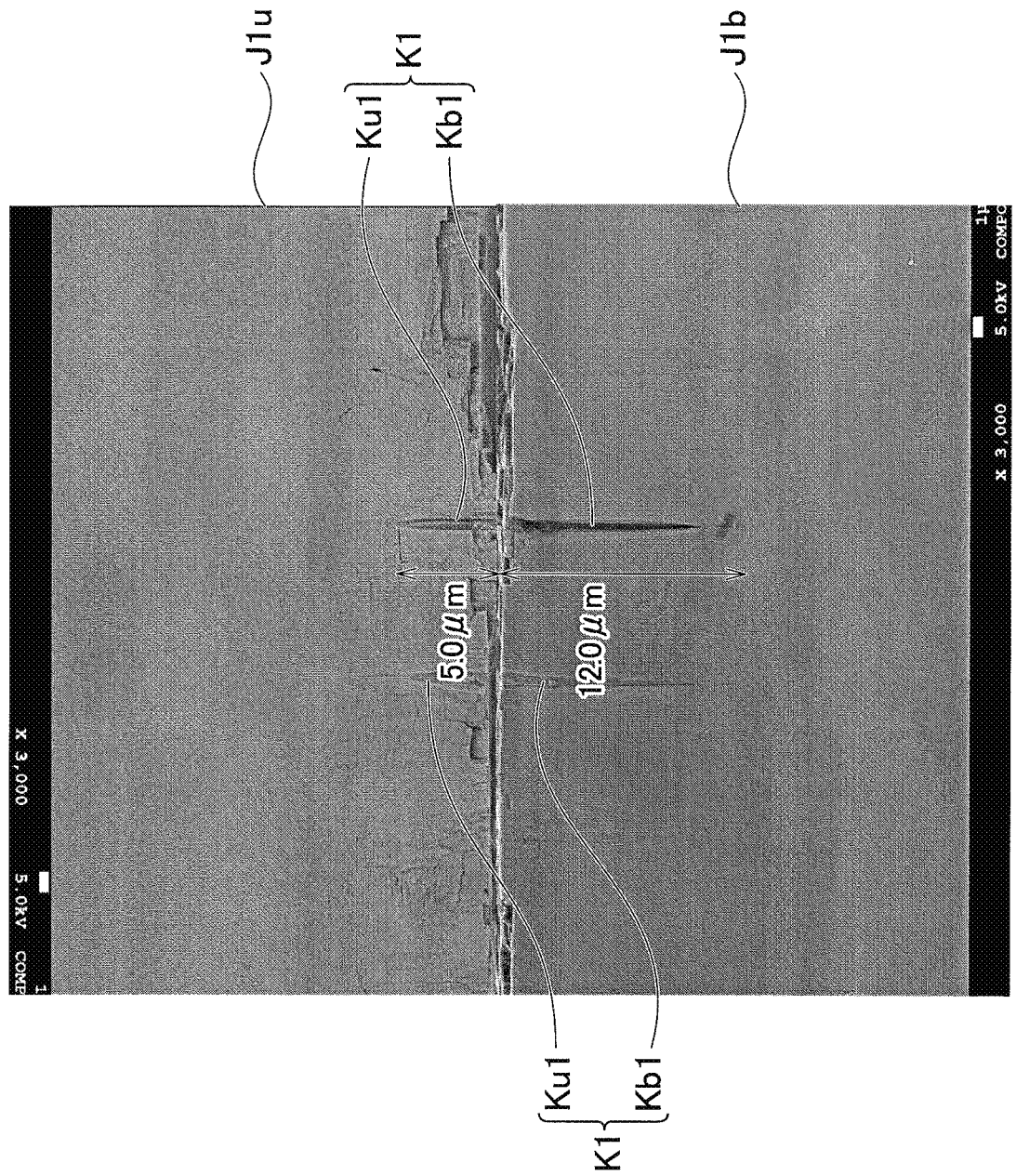
FIG. 19 is a photograph diagram for examination of the relative positions of the upper and lower test pieces in Experimental Example 3.
Figure 20:
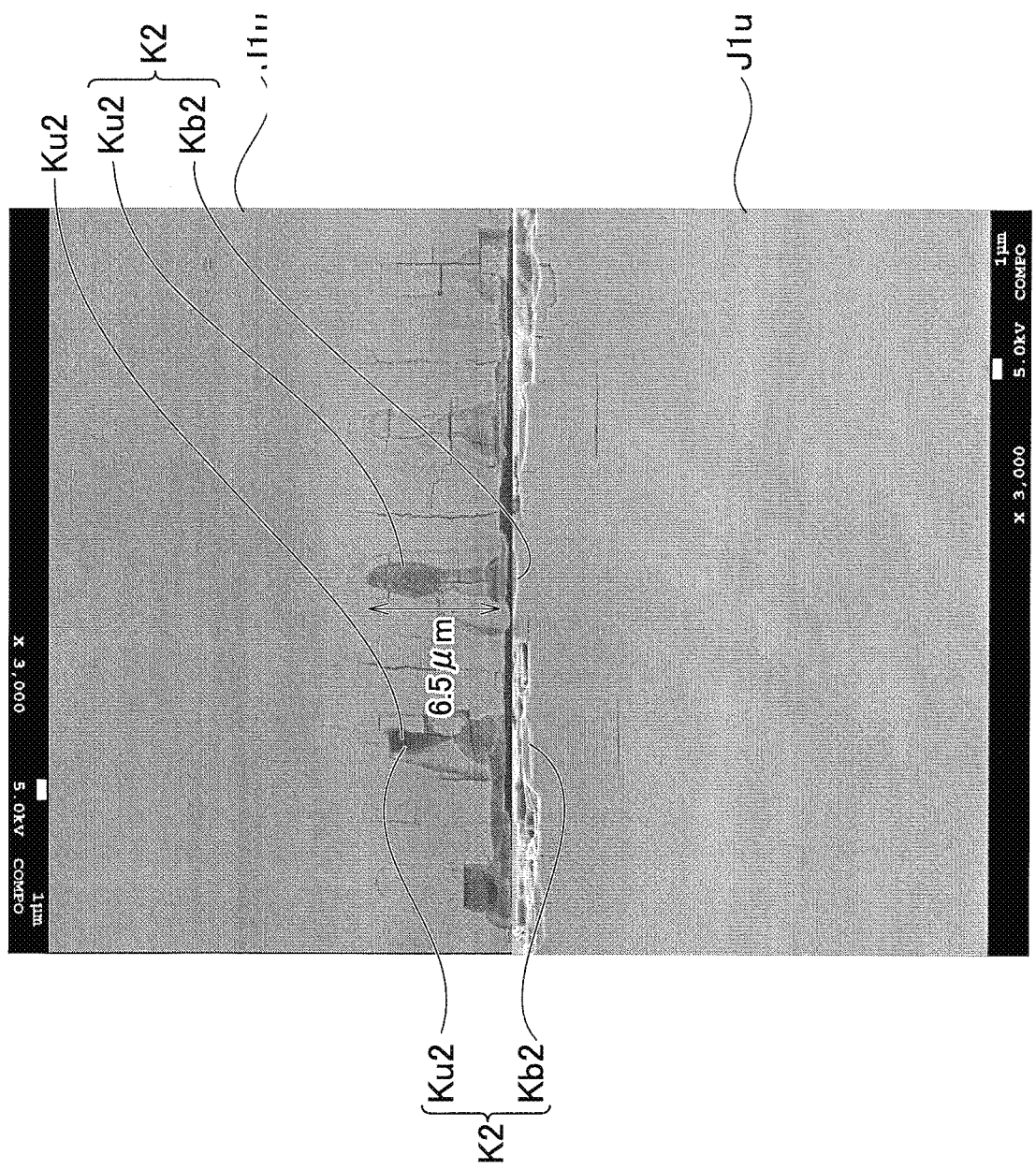
FIG. 20 is a photograph diagram for examination of the relative positions of the upper and lower test pieces in Experimental Example 3.
Figure 21:
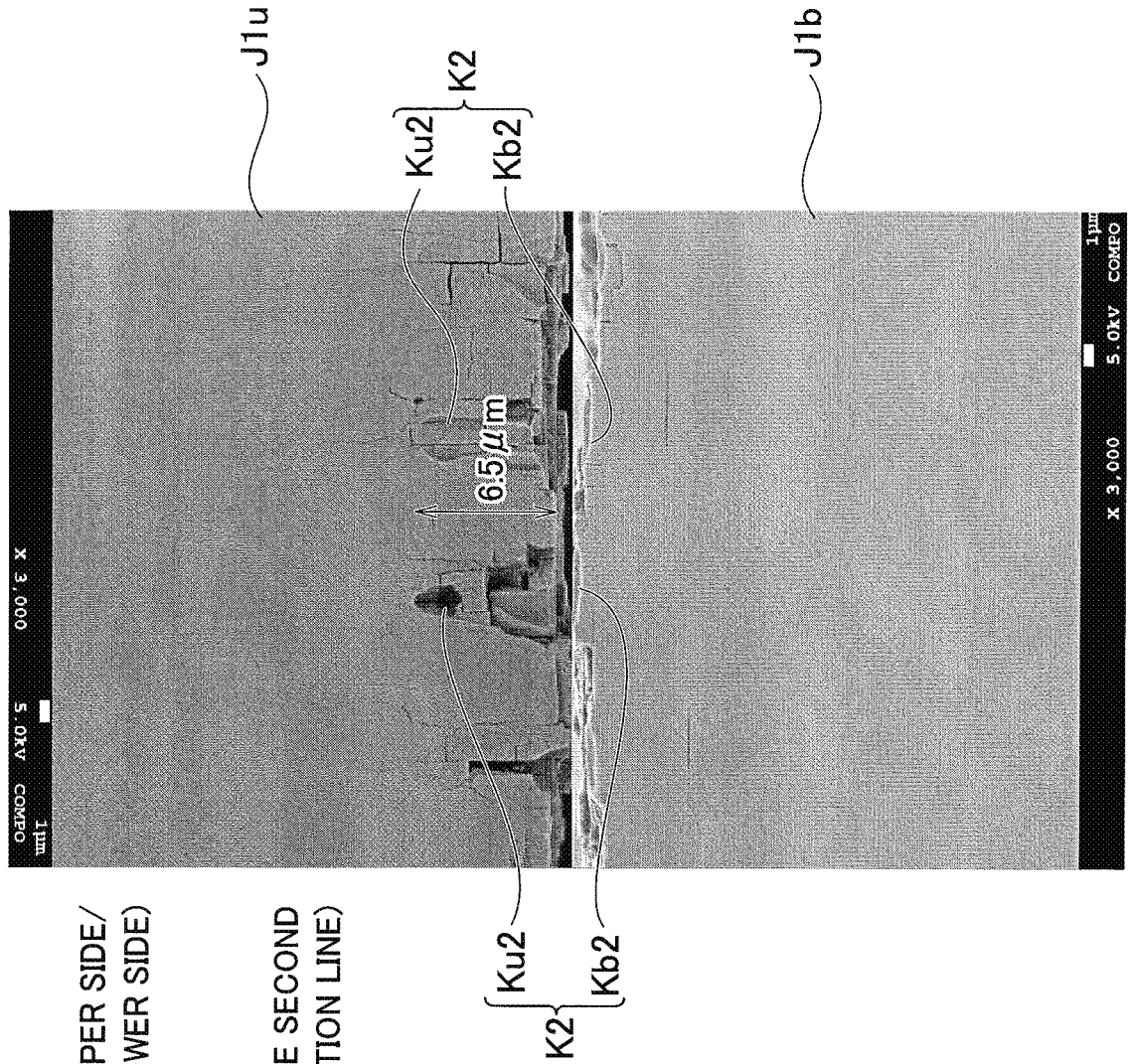
FIG. 21 is a photograph diagram for examination of the relative positions of the upper and lower test pieces in Experimental Example 3.

The inventor lays the separation plane of the upper test piece J1$u$ on the separation plane of the lower test piece J1$b$ to try alignment of the processing mark upper halves Ku1 and the processing mark lower halves Kb1. As a result, the positions of the processing mark upper halves Ku1 correspond to those of the respective processing mark lower halves Kb1 (see FIGS. 18 and 19) while the positions of the processing mark upper halves Ku2 correspond to those of the respective processing mark lower halves Kb2 (see FIGS. 20 and 21).

INDUSTRIAL APPLICABILITY

The magnesium oxide single crystal substrate peeled by the present disclosure can be formed efficiently, and accordingly, the peeled substrate obtained from the magnesium oxide single crystal substrate is useful for a high-temperature superconductive film, a ferroelectric film and the like, and is applicable to the field of semiconductor, the field of display, the field energy, and the like.

LIST OF REFERENCE SYMBOLS 10 substrate manufacturing apparatus
11 XY stage
11f stage surface
12 substrate placement member
13 correction ring
14 condenser
15 condenser lens
16 first lens
18 second lens
20 magnesium oxide single-crystal substrate (single-crystal member)
20p peeled substrate
20r irradiated surface
B laser beam
E periphery
EP beam focusing point
K1 processing mark
K2 processing mark
L1 irradiation line
L2 irradiation line
LK1 processing mark line
LK2 processing mark line
M center
MP beam focusing point
dp dot pitch
lp1 line pitch
lp2 line pitch

What is claimed is:

1. A substrate manufacturing method, comprising:
a first step of disposing a condenser for condensing a laser beam in a non-contact manner on an irradiated surface of a single crystal member of magnesium oxide to be irradiated;
a second step of irradiating the laser beam to the surface of the single crystal member and condensing the laser beam into the inner portion of the single crystal member under designated irradiation conditions using the condenser, and at a same time, two-dimensionally moving the condenser and the single crystal member relatively to each other, and sequentially forming processing mark lines in parallel; and
a third step of irradiating the laser beam to the surface of the single crystal member and condensing the laser beam into the inner portion of the single crystal member under designated irradiation conditions using the condenser, and at a same time, two-dimensionally moving the condenser and the single crystal member relatively to each other, and forming new processing mark lines between the adjacent processing mark lines formed by the irradiation in the second step to allow planar separation,
wherein, in the second step, the laser beam is condensed to form a reflection layer that reflects the laser beam,
wherein in the third step, the laser beam is reflected on the reflection layer,
and wherein the reflection layer is formed at an lower separation plane, holes are formed on an upper separation plane due to the reflection of the laser beam from the reflection layer, and a molten scattered substance from the upper separation layer is formed on the lower separation plane.

2. The substrate manufacturing method according to claim 1, wherein the single crystal member is a single crystal substrate.

3. The substrate manufacturing method according to claim 1, wherein as the laser beam, a laser beam with a pulse duration of 10 ns or less is irradiated.

4. The substrate manufacturing method according to claim 3, wherein as the laser beam, a laser beam with a pulse duration of 100 ps or less is irradiated.

5. The substrate manufacturing method according to claim 4, wherein as the laser beam, a laser beam with a pulse duration of 15 ps or less is irradiated.

6. The substrate manufacturing method according to claim 2, wherein as the laser beam, a laser beam with a pulse duration of 10 ns or less is irradiated.

7. The substrate manufacturing method according to claim 6, wherein as the laser beam, a laser beam with a pulse duration of 100 ps or less is irradiated.

8. The substrate manufacturing method according to claim 7, wherein as the laser beam, a laser beam with a pulse duration of 15 ps or less is irradiated.

* * * * *